United States Patent
Takaaki

[19]
[11] Patent Number: 6,137,318
[45] Date of Patent: *Oct. 24, 2000

[54] LOGIC CIRCUIT HAVING DUMMY MOS TRANSISTOR

[75] Inventor: Kodama Takaaki, Miyazaki, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/168,344

[22] Filed: Oct. 7, 1998

Related U.S. Application Data

[62] Division of application No. 08/987,834, Dec. 9, 1997.

[51] Int. Cl.$^7$ .................................................. H03K 19/094
[52] U.S. Cl. ............................... 326/112; 326/8; 326/120
[58] Field of Search ............................... 326/8, 112, 117, 326/119–121

[56] References Cited

U.S. PATENT DOCUMENTS

| | | | |
|---|---|---|---|
| 4,016,430 | 4/1977 | Kanezuka | 326/112 |
| 4,104,735 | 8/1978 | Hofmann et al. | |
| 4,142,176 | 2/1979 | Dozier | 326/120 |
| 4,384,220 | 5/1983 | Segawa et al. | 326/120 |
| 4,578,694 | 3/1986 | Ariizumi et al. | 326/120 |
| 4,583,011 | 4/1986 | Pechar | 326/8 |
| 4,591,744 | 5/1986 | Koike | 326/112 |
| 4,962,327 | 10/1990 | Iwazaki | |
| 5,051,618 | 9/1991 | Lou | 326/120 |
| 5,159,215 | 10/1992 | Murotani | |
| 5,274,278 | 12/1993 | Bauer et al. | |
| 5,434,814 | 7/1995 | Cho et al. | |
| 5,446,700 | 8/1995 | Iwase | |
| 5,615,164 | 3/1997 | Kirihata et al. | |
| 5,696,453 | 12/1997 | Maeda | 326/117 |
| 5,721,516 | 2/1998 | Kuruchi | 326/120 |

FOREIGN PATENT DOCUMENTS

| | | |
|---|---|---|
| 0378306 | 7/1990 | European Pat. Off. |
| WO 9009634 | 8/1990 | WIPO |

*Primary Examiner*—Michael Tokar
*Assistant Examiner*—Don Phu Le
*Attorney, Agent, or Firm*—Jones Volentine, LLP

[57] ABSTRACT

A constantly conductive MOS transistor is placed in a logic circuit including a plurality of switching MOS transistors. The switching MOS transistors and the constantly conductive MOS transistor are connected in series and each receive a control signal at their respective gates. The constantly conductive transistor is in a conductive state regardless of the state of its control signal. Thus, it is difficult for a third party to learn the true logic structure of the logic circuit by visual inspection, as the third party will tend to recognize the constantly conductive transistor as a true transistor contributing to the logic circuit, and not as a constantly conductive "dummy" transistor.

15 Claims, 12 Drawing Sheets

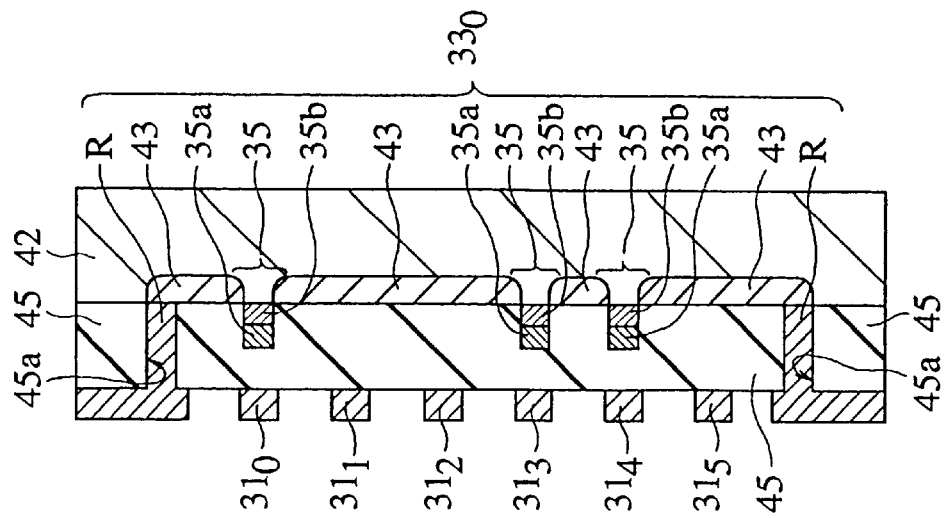
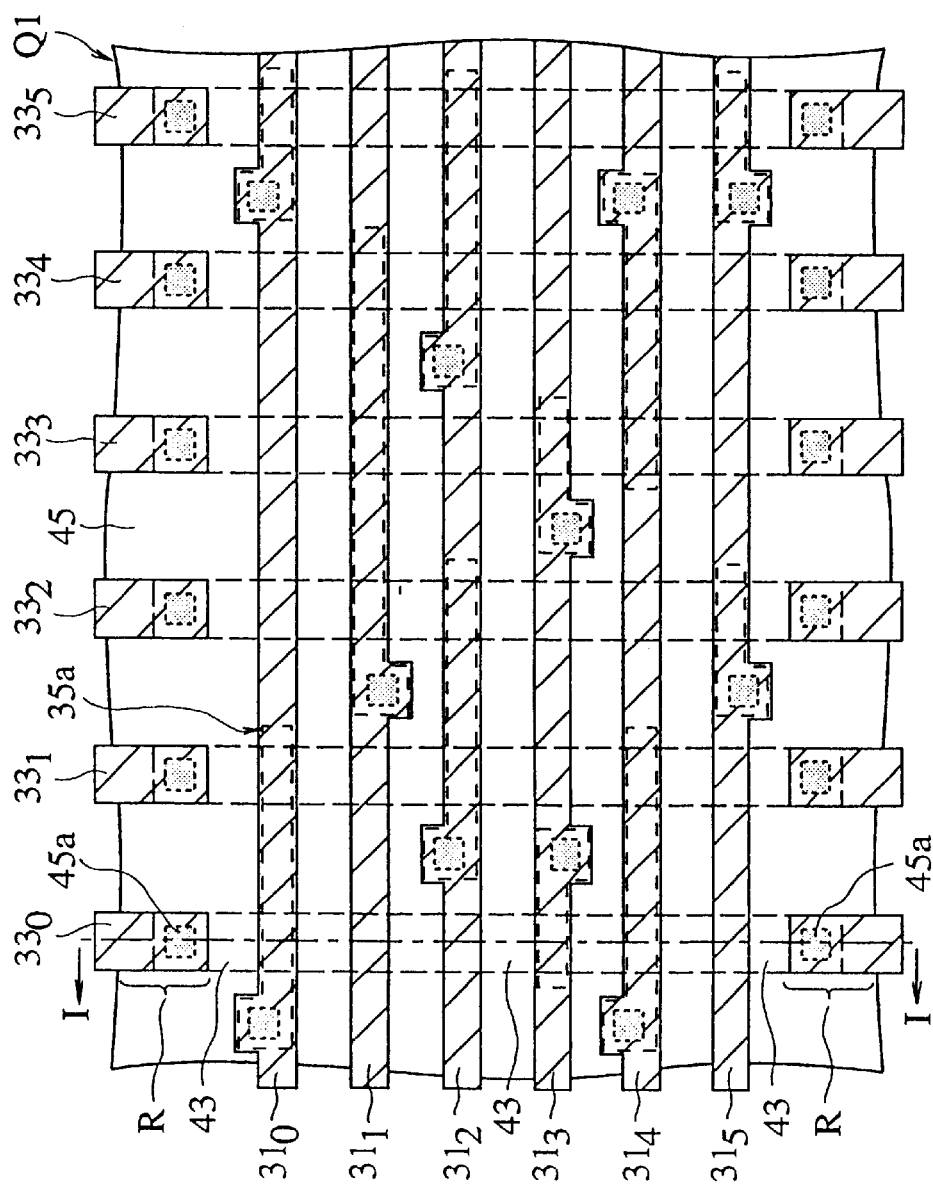
FIG. 2(A)
FIG. 2(B)

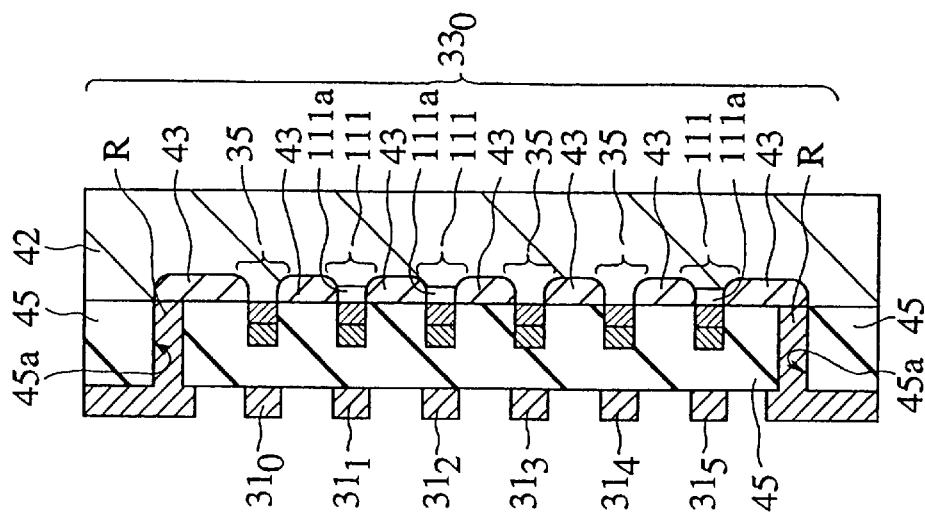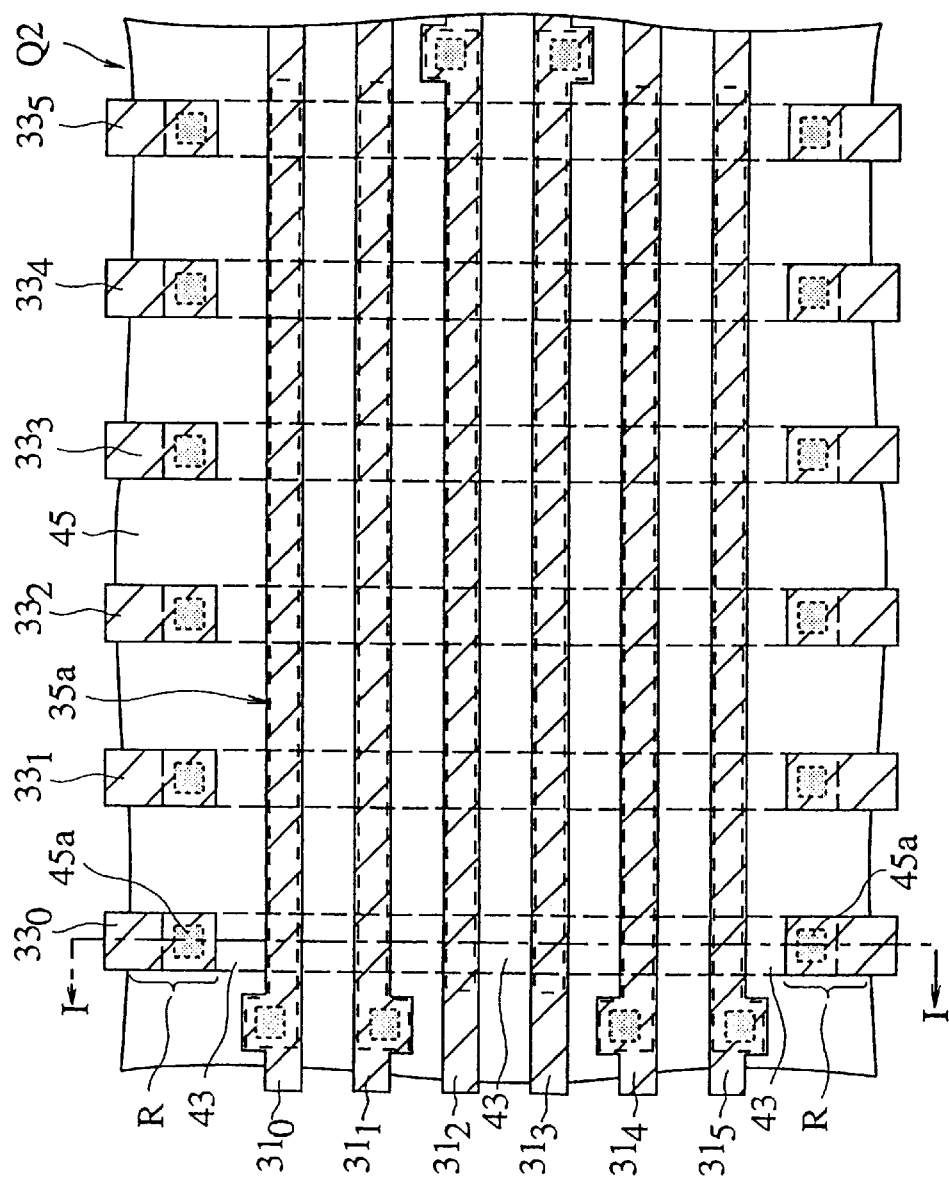

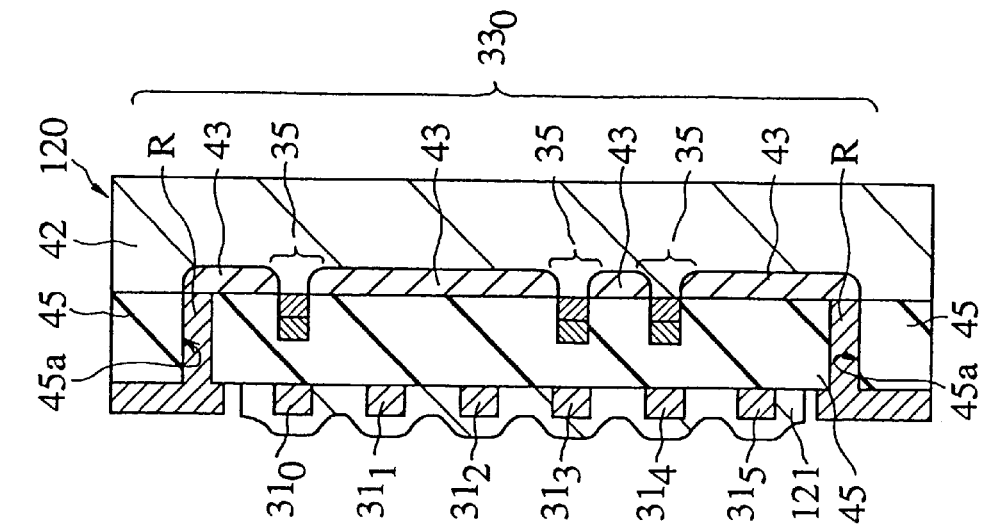
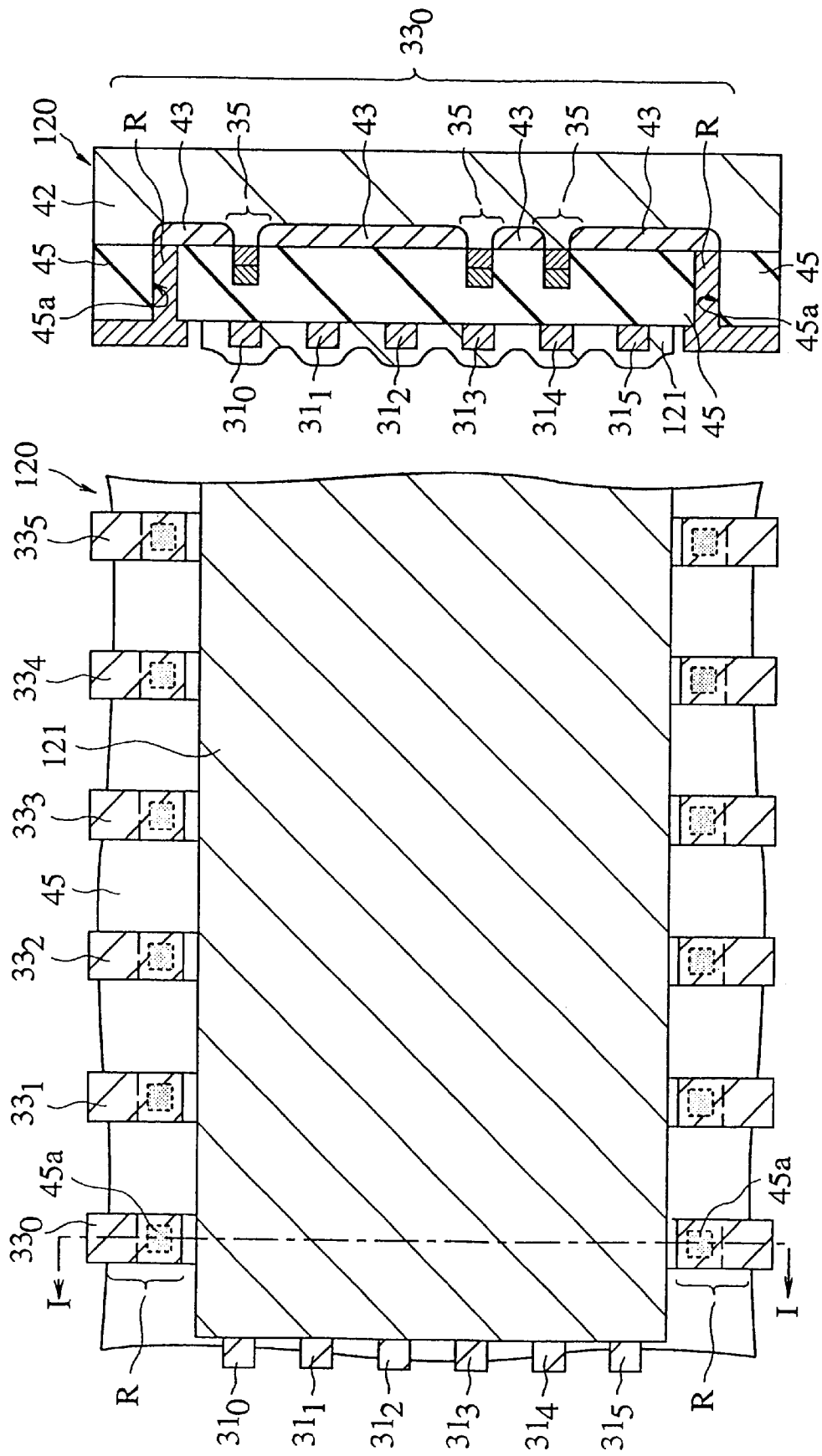

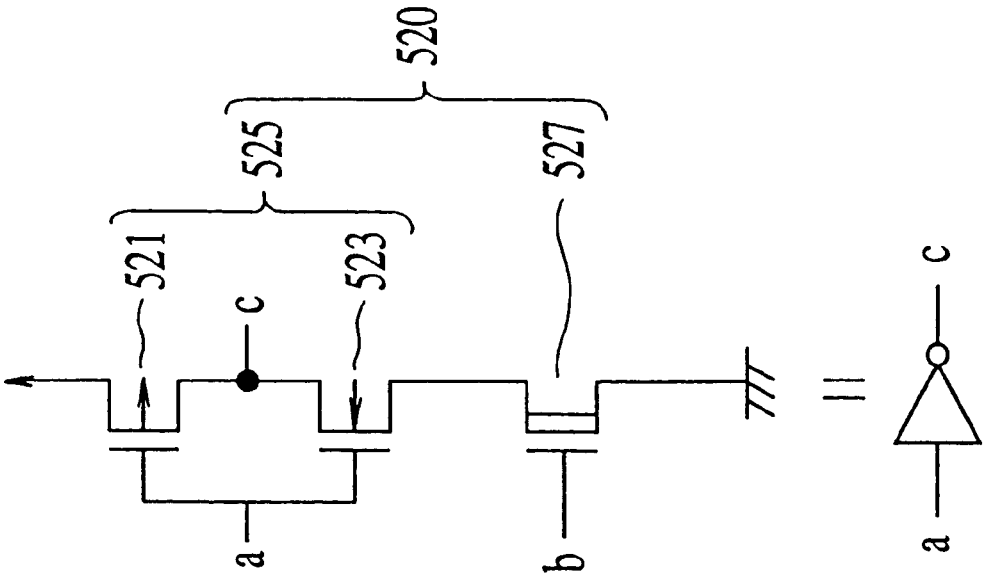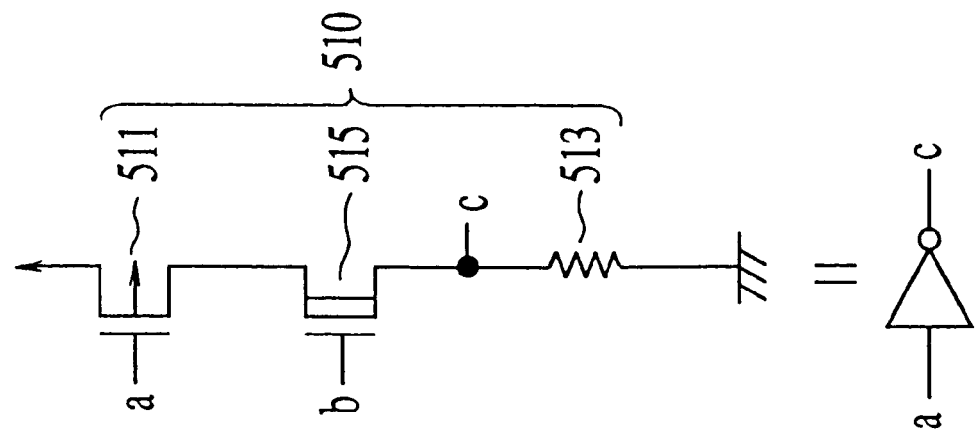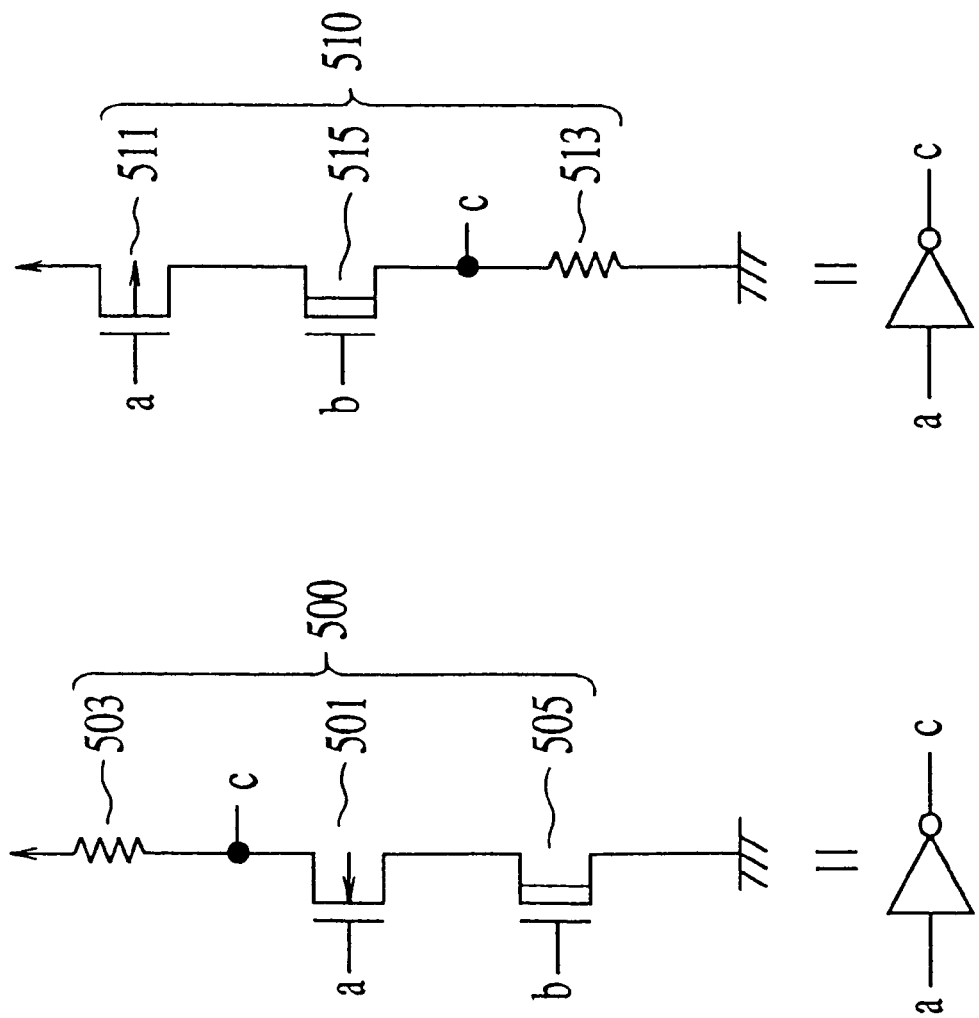

6,137,318

LOGIC CIRCUIT HAVING DUMMY MOS TRANSISTOR

CROSS REFERENCE TO RELATED APPLICATIONS

This is a divisional application of application Ser. No. 08/987,834, filed Dec. 9, 1997.

BACKGROUND OF THE INVENTION

1. Field of the Invention

The present invention relates to an address decoder, a semiconductor memory comprising the address decoder and a semiconductor device comprising at least one of a logical product circuit, a logical add circuit and an inverter circuit.

2. Description of the Related Art

A semiconductor memory represented by a RAM (Random Access Memory) and a ROM (Read Only Memory) comprises a row decoder and a column decoder for selecting a desired memory cell within a memory cell array provided therein. A conventional semiconductor memory of this type will be described with reference to FIG. 9. It is noted that, however, for brevity, FIG. 9 illustrates a memory cell array 10 having provided therein 8×8=64 memory cells (not shown).

The semiconductor memory comprises a memory cell array 10, a row decoder 30, a column decoder 50 and a sense amplifier 70. The row decoder 30 has terminals CL0 to CL7 connected to the memory cell array 10. The column decoder 50 has terminals R0 to R7 connected to the memory cell array 10 and a terminal 51 connected to the sense amplifier 70. The row decoder 30 and the column decoder 50 are thus connected to the memory cell array 10 through the terminals CL0 to CL7 and the terminals R0 to R7, respectively. The column decoder 50 is also connected to the sense amplifier 70 through the terminal 51.

When this semiconductor memory is used, first address designation signals A0 to A2 of three bits are inputted into the column decoder 50. Second address signals A3 to A5 of three bits are inputted into the row decoder 30. Then, depending on logical levels of respective bits of the first address designation signals A0 to A2, one of the terminals R0 to R7 of the column decoder 50 is selected. Depending on logical levels of respective bits of the second address designation signals A3 to A5, one of the terminals CL0 to CL7 of the row decoder 30 is selected. As a result, a memory cell positioned at an intersection (or crossover point) between a column selected by one bit signal among the first address designation signals A0 to A2 and a row selected by one bit signal among the second address designation signals A3 to A5, is selected.

A row decoder and a column decoder having structures described below are examples of the above-stated conventional row decoder 30 and column decoder 50.

An example of the structure of the row decoder 30 will be now described. FIG. 10 is a circuit diagram showing the inner structure of the row decoder 30.

The row decoder 30 comprises a first signal line group 31, a second signal line group 33, a plurality of switching devices 35, pull-up resistors 37, output inverters $39_0$ to $39_7$ and input logic adjustment inverters $41_0$ to $41_5$.

The first signal line group 31 consists of six parallel signal lines $31_0$ to $31_5$. The signal A3 out of the three address designation signals A3 to A5 is inputted into a signal line $31_1$ in the first signal line group 31. The signal A4 is inputted into a signal line $31_3$. The signal A5 is inputted into a signal line $31_5$. A signal $\overline{A3}$ opposite in phase to the signal A3 is inputted into a signal line $31_0$ in the first signal line group 31. A signal $\overline{A4}$ opposite in phase to the signal A4 is inputted into a signal line $31_2$, and a signal $\overline{A5}$ opposite in phase to the signal A5 is inputted into a signal line $31_4$. Here, a signal of opposite phase such as $\overline{A3}$ is at L (or H) level when a signal A3 is at H (or L) level.

To realize the input of address designation signals as described above, the signal A3 is inputted into the signal line $31_1$ through the inverters $41_0$ and $41_1$, and the output of the inverter $41_0$ is inputted as the signal $\overline{A3}$ into the signal line $31_0$. The signal A4 is inputted into the signal line $31_3$ through the inverters $41_2$ and $41_3$, and the output of the inverter $41_2$ is inputted as the signal $\overline{A4}$ into the signal line $31_2$. Moreover, the signal A5 is inputted into the signal line $31_5$ through the inverters $41_4$ and $41_5$, and the output of the inverter $41_4$ is inputted as the signal $\overline{A5}$ into the signal line $31_4$.

The second signal line group 33 consists of eight parallel signal lines $33_0$ to $33_7$. The second signal line group 33 is arranged to intersect the first signal line 31. It is noted that, in actuality, the second signal lines $33_0$ to $33_7$ include switching devices 35, respectively and an impurity diffused layer formed on a semiconductor substrate (see FIG. 11(B)), which description will be given below.

Each of the switching devices 35 is provided in the vicinity of a plurality of predetermined intersections among intersections (or crossover points) P between the first signal line group 31 and the second signal line group 33, although only part of the intersections are denoted by P in FIG. 10. The intersections will be described later.

Each of the switching devices 35 has a control signal input terminal 35a. The switching device 35 can be made out of an enhancement type P-channel or N-channel field effect transistor. In FIG. 10, the switching devices 35 consist of enhancement type N-channel field effect transistors, respectively. The control signal input terminal (or, to be specific, a gate electrode) 35a of each switching device 35 is connected to a first signal line closest to the corresponding intersection. The switching device 35 per se is connected, in series, to a second signal line closest to the intersection. Specifically, each switching device 35 is connected to the second signal line through a drain serving as a first main electrode and a source serving as a second main electrode. (See FIG. 11(B) for more detailed illustration.)

In this case, the predetermined intersections, i.e. crossover points in the vicinity of which the switching devices 35 are provided, are set as follows. Assume that a value m which is one of values 0 to 7 in decimal notation is defined as address designation signals A3 to A5. In the conventional row decoder 30, switching devices 35 are provided such that when the value m is inputted into the first signal line group 31, the provided switching devices 35 become conductive and a m-th second signal line, that is, second signal line $33_m$ corresponding to the value m in the decimal notation out of the signal lines $33_0$ to $33_7$ in the second signal line group 33) turns into a first electric state (a conductive state in this case).

More specifically, in the prior art of FIG. 10, in respect of the 0-th signal line in the second signal line group 33 or signal line $33_0$, the switching devices 35 are provided in the vicinity of intersections between the second signal line $33_0$ and the first signal line $31_0$, $31_2$ and $31_4$, respectively. Due to this, when (0, 0, 0) (corresponding to "000" in the binary notation), that is, m=0 (in the decimal notation) is inputted as address designation signals A3, A4 and A5, respective switching devices 35 in the vicinity of the above intersections are turned on and other switching devices 35 provided in the vicinity of the intersections between second signal lines other than the 0-th signal 33$_0$ and the first signal lines 31$_0$, 31$_2$ and 31$_4$ are turned off, respectively. As a result, only the 0-th signal line 33$_0$ in the second signal line group 33 is selectively conductive. As regards, for example, the 7th signal line 33$_7$ in the second signal line group 33, switching devices 35 are provided in the vicinity of intersections between the second signal line 33$_7$ and the first signal lines 31$_1$, 31$_3$ and 31$_5$, respectively. Due to this, when (1, 1, 1) (corresponding to "111" in the binary notation), that is, m=7 (in the decimal notation) is inputted as address designation signals A3, A4 and A5, the switching devices 35 in the vicinity of these intersections are turned on and other switching devices 35 provided in the vicinity of the intersections between second signal lines other than the 7th signal line 33$_7$ and the first signal lines 31$_1$, 31$_3$ and 31$_5$ are turned off, respectively. As a result, only the 7th signal line 33$_7$ in the second signal line group 33 is selectively conductive.

In this way, in the conventional row decoder 30, if the value m is inputted as the address designation signals A3, A4 and A5, the signal line 33$_m$ corresponding to the value m becomes conductive. The relationship is shown in Table 1 below.

TABLE 1

| Value m designated by A3–A5 (A0–A2) | Signal line in first state (conductive state) among signal lines 33$_0$ to 33$_7$ |
| --- | --- |
| 0 | 33$_0$ |
| 1 | 33$_1$ |
| 2 | 33$_2$ |
| 3 | 33$_3$ |
| 4 | 33$_4$ |
| 5 | 33$_5$ |
| 6 | 33$_6$ |
| 7 | 33$_7$ |

The pull-up resistors 37 connect the signal lines 33$_0$ to 33$_7$ in the second signal line group 33 to the power supply V, respectively.

Input terminals of the output inverters 39$_0$ to 39$_7$ are connected to nodes between the second signal lines 33$_0$ to 33$_7$ and the pull-up resistors 37, respectively.

In the row decoder 30, when (0, 0, 0) is inputted as an address designation signal, the signal line 33$_0$ in the second signal line group 33 turns into a conductive state based on the above-described principle while other signal lines 33$_1$ to 33$_7$ turn into a second electric state, that is, a non-conductive state. Due to this, the input terminal of the inverter 39$_0$ becomes H level while input terminals of the remaining inverters 39$_1$ to 39$_7$ become L level. As a result, the terminal CL0 becomes H level and the terminals CL1 to CL7 become L level. Therefore, one of the terminals CL0 to CL7 (CL0 in this case) can be selectively made H level.

The following structure is typical of the actual structure of the row decoder 30 on and in the semiconductor substrate. Description will be given with reference to FIGS. 11(A) and (B). FIG. 11 is a plan view where a portion Q indicated by a broken line in FIG. 10 is emphatically shown. FIG. 11(B) is a cross-sectional view taken along lines I—I of FIG. 11(A). It is noted that FIG. 11(B) is a cross-sectional view where a section is emphatically illustrated.

In FIGS. 11(A), 11(B), reference numeral 35 denotes a gate insulating film of a field effect transistor 35; 42 a silicon substrate as a semiconductor substrate; 43 an impurity diffused region (source-drain region) in an active region; 45 an interlayer insulating film; and 45a a contact hole provided in the interlayer insulating film 45.

As can be understood from FIG. 11, in the actual structure, band-shaped active regions are formed in planned portions (including the impurity diffused region 43 in FIG. 11) for the formation of the second signal lines 33$_0$ to 33$_7$, respectively on the semiconductor substrate 42. The first signal lines 31$_0$ to 31$_5$ in the first signal line group 31 are constituted by part of a wiring or interconnecting member (on a first layer) provided on the interlayer insulating film 45. In addition, as can be, in particular, understood from FIG. 11(B), the signal lines (the signal line 33$_0$ in FIG. 11(B)) in the second signal line group 33 are constituted by portions where part R of the wiring member on the first layer, the impurity diffused region 43 and the field effect transistors 35 are connected in series. In FIG. 11(B), while the three field effect transistors 35 are being turned on, the second signal line 33$_0$ is conductive.

Meanwhile, a column decoder having a structure to be described below with reference to FIG. 12 is an example of the above-stated conventional column decoder 50. That is, it is an address decoder having a structure in which the pull-up resistors 37 and the output-side inverters 39$_0$ to 39$_7$ are removed from the constituent elements of the row decoder 30 described with reference to FIG. 10 and in which signals A0 to A2 are inputted as address designation signals.

In the column decoder 50, when a value m (where m=0 to 7) is inputted as the address designation signals A0 to A2, a signal line 33$_m$ in the second signal line group 33 becomes conductive and the remaining signal lines in the group 33 become non-conductive. Due to this, the signal line R$_m$ among the signal lines R0 to R7 in the column direction of the memory cell array 10 can be selected. The relationship between the value m indicated by the address designation signals A0 to A2 and the conductive signal line 33$_m$ can be expressed by truth values shown in Table 1 above.

However, in the conventional row decoder 30 and column decoder 50 mentioned above, the switching devices 35 are arranged regularly. Description will be given thereto below.

It is observed whether or not switching devices 35 are provided in the vicinity of intersections between the signal lines 31$_1$, 31$_3$ and 31$_5$ in the first signal line group 31 and the signal lines 33$_0$ to 33$_7$ in the second signal line group 33, respectively. The observation is made from left to right, that is, from second signal lines 33$_0$ to 33$_7$ in the second signal line group 33 and from top to bottom in FIG. 10. Then, it is seen that no switching device is provided in the vicinity of three intersections between, for example, the signal line 33$_0$ and the signal lines 31$_1$, 31$_3$, 31$_5$, respectively. Such a state is expressed as (0, 0, 0). It is noted that '0' dignifies that a switching device 35 is not provided in the vicinity of an observed intersection while '1' dignifies that the device 35 is provided therein.

In case of three intersections (or crossover points) between the signal line 33$_1$ and the signal lines 31$_1$, 31$_3$, 31$_5$, respectively, a switching device 35 is provided in the vicinity of the intersection between the signal line 33$_1$ and the signal line 31$_1$ while no switching device 35 is provided in the vicinity of other two intersections. This state is (1, 0, 0). Likewise, states of the signal lines 33$_2$ to 33$_7$ are (0, 1, 0), (1, 1, 0), (0, 0, 1), (1, 0, 1), (0, 1, 1) and (1, 1, 1), respectively.

Namely, in the conventional row decoder 30 and column decoder 50, the switching devices 35 are arranged in a regular manner corresponding to the arrangement order of three bits in the binary notation. This produces a problem that the third party can easily analyze which signal line is conductive in the second signal line group 33 when address designation signals are inputted.

There is a case where the third party reads data within the memory cell array by using, for example, a probe and tries to misuse the data. To do so effectively, the third party may well first analyze which signal line is conductive in the second signal line group 33 when address designation signals are inputted.

It is of course possible to sequentially change address designation signals and to analyze which signal lines become conductive in the second signal line group in accordance with which address designation signals by using a probe one by one. However, consecutive analysis using a probe, if applied to a large-scale semiconductor memory, requires considerable time and labor. It is preferable for the third party intending to misuse data to discover which signal line in the second signal line group 33 is conductive in accordance with which address designation signals from the arrangement of the switching devices in the row and column decoders, that is, from a visual layout. In that case, in the conventional address decoder, it is easy to analyze which signal line in the second signal line group 33 is conductive according to certain address designation signals from the arrangement of the switching devices and, therefore, the third party tends to easily read data in the memory cell array and the like. This is not desirable in view of information security.

It is therefore an object of the present invention to provide an address decoder capable of making it more difficult to visually analyze which signal line in the second signal line group is conductive according to inputted address designation signals than in the case of the conventional decoder.

It is another object of the present invention to provide a semiconductor memory which data is difficult to misuse by a third party.

Furthermore, in case of a semiconductor device comprising at least one of a logical product circuit (AND circuit), a logical add circuit (OR circuit) and an inverter circuit, it is preferable that the true structure thereof cannot be easily observed visually to prevent a third party from imitating the semiconductor device and the like. Therefore, it is yet another object of the present innovation to provide a semiconductor device having a structure in which the true structures of at least one of a logical product circuit, a logical add circuit and an inverter circuit are difficult to observe visually.

SUMMARY OF THE INVENTION (1) An address decoder according to the first mode of present invention comprises a first signal line group into which address designation signals m are inputted, where m=0 to n and n is a positive integer, a second signal line group intersecting the first signal line group and consisting of signal lines numbered 0 to n, and switching devices respectively provided in the vicinity of a plurality of predetermined intersections out of intersections (or crossover points) between the first and second signal line group. The switching devices have their control signal input terminals connected to first signal lines in the first signal line group, respectively, and have their main current path connected, in series, to the second signal lines in the second signal line group, respectively. Each of the switching devices is on/off controlled in accordance with the address designation signals m to thereby turn one of the signal lines in the second signal line group into a first electric state. According to the constitution of the address decoder, the predetermined intersections are set such that one of the signal lines other than a signal line numbered m out of the signal lines numbered 0 to n in accordance with at least two kinds of the address designation signals m.

According to the first mode of the present invention, the switching devices are arranged more irregularly than those in the conventional address decoder described with reference to FIG. 10 or 12. This can make it more difficult for a third party to analyze which signal line in the second signal line group is turned into the first electric state, for example, conductive state in accordance with address designation signals from the arrangement of the switching device than in the case of the conventional address decoder.

To carry out the first mode of the present invention, the simplest way to determine the predetermined intersections is to set them such that when $m_1$ is inputted as address designation signals, a $m_2$-th signal line in the second signal line group is conductive and such that when $m_2$ is inputted as address designation signals, $m_1$-th signal line in the second signal line group is conductive. Alternatively, the predetermined intersections can be set such that signal lines numbered 0 to n other than the signal line numbered m are selectively conductive in accordance with, for example, three or four kinds of address designation signals. It is also possible that the signal lines numbered 0 to n other than the signal line numbered m selectively turn into a conductive state in accordance with each of said address designation signals m. That is, the second signal lines numbered, for example, 3, 0, 7, 5, 6, 1, 4 and 2 out of the signal lines numbered 0 to 7 are conductive in accordance with, for example, the address designation signals 0, 1, 2, 3, 4, 5, 6 and 7 in due order. This invites much more preferable and irregular arrangement of the switching devices.

An address decoder according to the second mode of the present invention comprises a first signal line group into which address designation signals m are inputted, where m=0 to n and n is a positive integer, a second signal line group intersecting the first signal line group and consisting of signal lines numbered 0 to n, and switching devices respectively provided in the vicinity of a plurality of predetermined intersections out of intersections (or crossover points) between the first and second signal line group. The switching devices have their control signal input terminals connected to first signal lines in the first signal line group, respectively, and have their main current paths connected, in series, to the second signal lines in the second signal line group, respectively. Each of the switching devices is on/off controlled in accordance with the address designation signals m to thereby turn one of the signal lines in the second signal line group into a first electric state. The address decoder further comprises constantly conductive switching devices (Normally-On type) provided in the vicinity of all or part of the intersections other than the predetermined intersections. The constantly conductive switching devices are provided such that their control signal input terminals are connected to the first signal lines, respectively and that their main current paths are connected, in series, to the second signal lines, respectively.

The address decoder in the second mode according to the present invention has a structure in which not only switching devices on/off controlled in accordance with address designation signals but also constantly conductive switching devices are included in the switching device matrix. Since the constantly conductive switching devices are constantly conductive, they do not contribute to switching operation and they function as dummy switching devices camouflaging the arrangement of the true or normal switching devices. Due to this, compared to the conventional address decoder described with reference to FIG. 10 or 12, it is difficult to specify the arrangement of the true switching devices. As a result, even if a third party tries to analyze which signal line in the second signal line group is conductive according to address designation signals, it is more difficult to do so than in the case of the conventional address decoder.

To carry out the second embodiment according to the present invention, it is desired that the constantly conductive switching devices (dummy switching devices) are respectively provided in the vicinity of all intersections other than the predetermined intersections. This is because the less clearly arrangement of the true switching devices can be provided. This is also preferable for the manufacture of a semiconductor memory and for providing a smaller semiconductor memory, compared to a case where the constantly conductive switching devices are provided partly.

To carry out the second mode according to the present invention, it is further preferable that the constantly conductive switching devices are provided to make it difficult to discriminate them from the true switching devices. It is, for example, desirable that dimensions of respective elements, such as the gate length and gate width of a field effect transistor, as well as arrangement of the elements are the same as those of the true switching devices.

An address decoder according to the third mode of the present invention comprises a first signal line group into which address designation signals m, where m=0 to n, n is a positive integer, is inputted, a second signal line group intersecting the first signal line group and consisting of signal lines numbered 0 to n, and switching devices respectively provided in the vicinity of a plurality of predetermined intersections out of intersections (or crossover points) between the first and second signal line group. The switching devices have their control signal input terminals connected to first signal lines in the first signal line group, respectively, and their main current paths connected, in series, to second signal lines in the second signal line group, respectively. Each of the switching devices is on/off controlled in accordance with the address designation signals m to thereby turn one of the signal lines in the second signal line group into a first electric state. The address decoder further comprises a shielding film for preventing connection relationship between the control signal input terminal of each of the switching device and each of the signal lines in the first signal line group from being visually recognized.

According to the third mode of the present invention, since the shielding film is provided, it is possible to make it more difficult to confirm the arrangement of the switching devices than in the case of the conventional decoder. Due to this, even if a third party tries to analyze which signal line in the second signal line group turns into a first state in accordance with address designation signals from the arrangement of the switching devices, he or she finds it more difficult to do so than in the case of the conventional decoder.

In a preferred embodiment according to the present invention, it is preferable that the address decoder has a structure in which intersections in the vicinity of which true switching devices are provided are irregularly arranged and which constantly conductive switching devices (i.e. dummy switching devices) are provided in the vicinity of part or all of the intersections other than those in which the true switching devices are provided, respectively.

In another embodiment according to the present invention, an address decoder can has a structure in which intersections in the vicinity of which true switching devices are provided are arranged irregularly and which a shielding film is provided.

Furthermore, the address decoder according to the present invention preferably has a structure in which intersections in the vicinity of which true switching devices are provided are arranged irregularly, which constantly conductive switching devices are provided in the vicinity of part or all of the intersections other than those in the vicinity of which the true switching devices are provided, respectively, and which a shielding film is provided.

In yet another preferred embodiment according to the present invention, an address decoder preferably has a structure in which constantly conductive switching devices are provided in the vicinity of which part or all of the intersections other than those in the vicinity of which true switching devices are provided and which a shielding film is provided.

The address decoder in each of the preferred embodiments according to the present invention has a complex structure since not less than two of the first to third modes according to the present invention are combined. As a result, it is possible to make it more difficult for a third party to visually recognize which signal line in the second signal line group is conductive in accordance with inputted address designation signals than in the first to third modes according to the present invention.

(2) A semiconductor device according to the present invention comprises a memory cell array and a row and column decoders connected to the memory cell array, respectively. One of the address decoders of the above-described structures is used as at least one of the row decoder and the column decoder. Due to this, it is possible to provide a semiconductor device capable of making it difficult to visually grasp which signal line in the second signal line group is conductive in accordance with inputted address designation signals. As a result, a semiconductor device capable of making it more difficult for a third party to misuse the data of the device than in the case of the conventional device.

(3) A semiconductor device, including a logical product circuit, according to the present invention comprises a switching device sequence (or array), a pull-up resistor and at least one constantly conductive switching device. The switching device sequence or array has at least two switching devices connected in series. The switching devices is on/off controlled in accordance with a signal inputted into their control signal terminal. The pull-up resistor pulls out an output node of the switching device sequence to a power supply. The constantly conductive switching device has its control signal input terminal connected in series to the switching device sequence.

Another semiconductor device, including a logical add circuit, according to the present invention comprises a switching device sequence, a pull-down resistor and at least one constantly conductive switching device. The switching device sequence has at least two switching devices connected in series. The switching devices is on/off controlled in accordance with a signal inputted into their control signal terminal. The pull-down resistor pulls down an output node of the switching device sequence to a ground. The constantly conductive switching device has its control signal input terminal connected in series to the switching device sequence.

According to the semiconductor device of the present invention, the control input terminals of the on/off controlled switching devices and those of the constantly conductive switching devices are recognized as input terminals of the logical product circuit or logical add circuit by a third party. However, the control input terminals of the on/off controlled switching devices contribute to the actual operation. Namely, although the actual circuit is the logical product circuit or logical add circuit having n inputs (where n is an integer not less than 2), it is possible to make a third party visually recognize it as a logical product circuit or logical add circuit having (n+α) inputs (where α is an integer not less than 1). As a result, it is possible to make it difficult for the third party to, for example, imitate the semiconductor device.

A semiconductor device, including an inverter circuit, according to the present invention comprises a switching device, a pull-up or pull-down resistor and at least one constantly conductive switching device. The switching device has its control signal input terminal and is on/off controlled in accordance with a signal inputted into the control signal input terminal. The pull-up resistor pulls up an output node of the switching device to a power supply. The pull-down resistor pulls down the output node of the switching device to a ground. The constantly conductive switching device has its control signal input terminal connected in series to the switching device.

Still another semiconductor device of the present invention, control input terminals of on/off controlled switching devices and those of constantly conductive switching devices are visually recognized as input terminals by a third party. Due to this, although the circuit is an inverter circuit, it is possible to make the third party recognize the circuit as a logical product circuit or logical add circuit. As a result, it is possible to make it difficult for a third party to, for example, imitate the semiconductor device.

Still another semiconductor device, including a CMOS inverter comprising a series circuit of p-channel and n-channel field effect transistors, according to the present invention includes as a part of the CMOS inverter at least an enhancement type field effect transistor connected in series to the series circuit.

Therefore, although it is a CMOS inverter, it is possible to make a third party recognize it as a logical circuit other than a CMOS inverter. This can thus make it difficult for the third party to, for example, imitate the semiconductor device.

BRIEF DESCRIPTION OF THE DRAWINGS

The foregoing and other objects, features and advantages of the present invention will be better understood from the following description taken in connection with the accompanying drawings, in which:

FIG. 2 is an explanatory diagram of the first embodiment of the address decoder according to the present invention, wherein, in particular, FIG. 2(A) is a plan view for describing the actual structure of a part Q1 of FIG. 1, and FIG. 2(B) is a cross-sectional view taken along lines I—I of FIG. 2(A);

FIG. 4 is an explanatory diagram of the first embodiment of the address decoder according to the present invention, wherein, in particular, FIG. 4(A) is a plan view for describing the actual structure of a part Q2 of FIG. 3, and FIG. 4(B) is a cross-sectional view taken along lines I—I of FIG. 4(A);

FIG. 5 is a circuit diagram for explaining a third embodiment of an address decoder according to the present invention, wherein, in particular, FIG. 5(A) is a plan view for describing the actual structure of a part of the address decoder, and FIG. 5(B) is a cross-sectional view taken along lines I—I of FIG. 5(A);

FIG. 6 is an explanatory diagram of a semiconductor device comprising a logical product circuit, wherein, in particular.

FIGS. 8A–8C are a circuit diagram for explaining a semiconductor device comprising an inverter circuit, in which the inverter circuit is emphatically illustrated;

FIG. 11 is a diagram for explaining the prior art and problems thereof, wherein, in particular.

DETAILED DESCRIPTION OF THE PREFERRED EMBODIMENT

Figure 10:
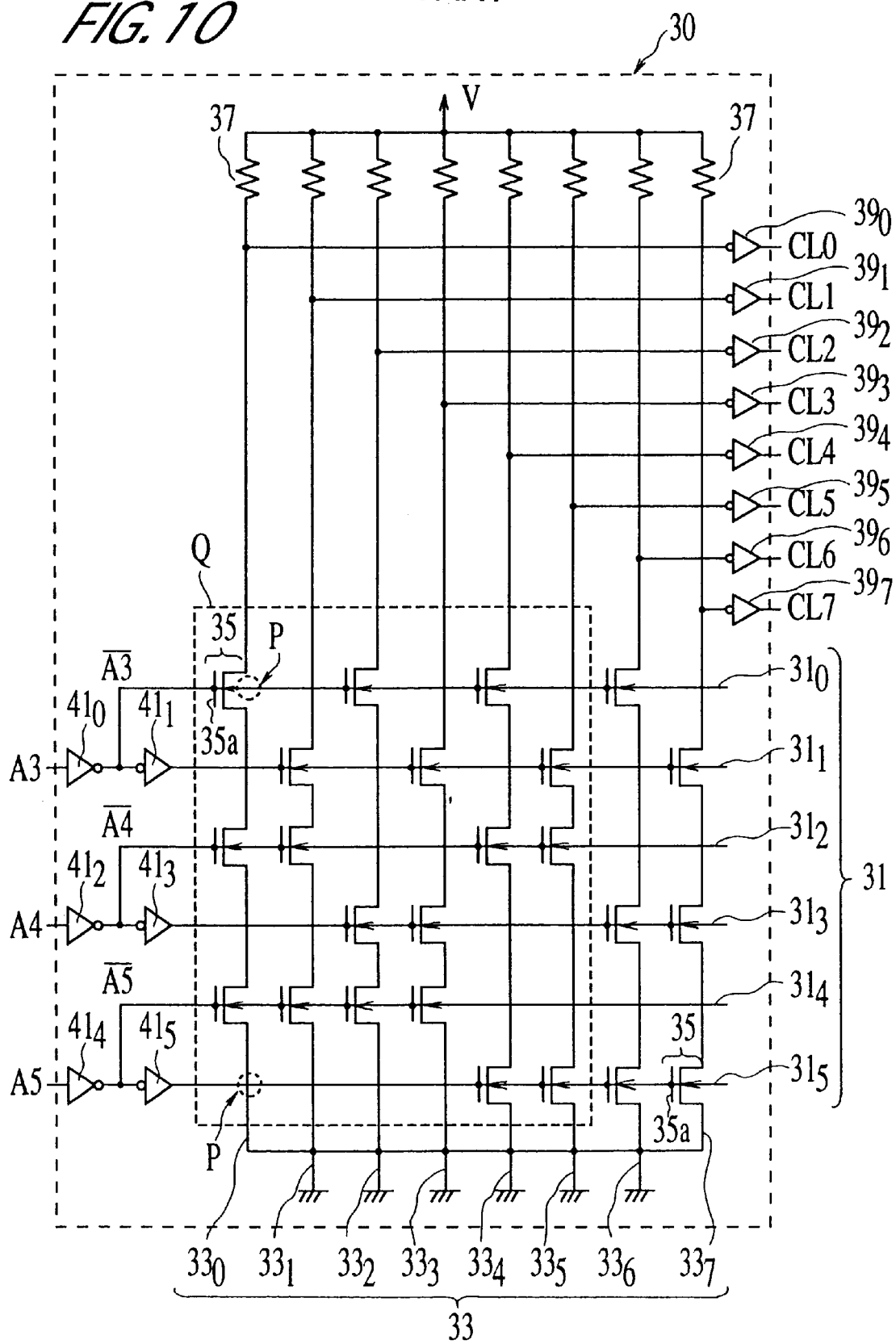
FIG. 10 is a diagram for explaining the prior art and problems thereof, particularly, on the basis of one example of the structure of the conventional row decoder.
Figure 11B:
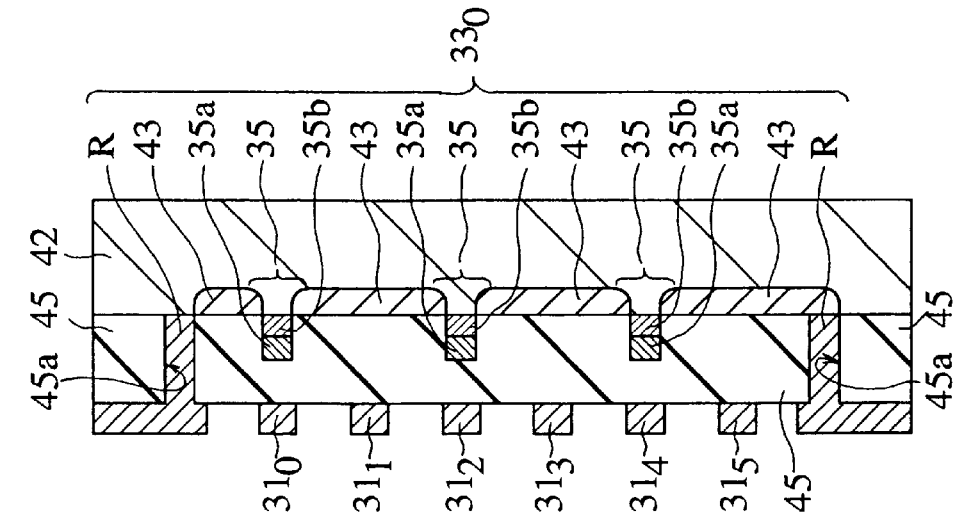
FIG. 11(B) is a cross-sectional diagram taken along lines I—I of FIG. 11(A)
Figure 11A:
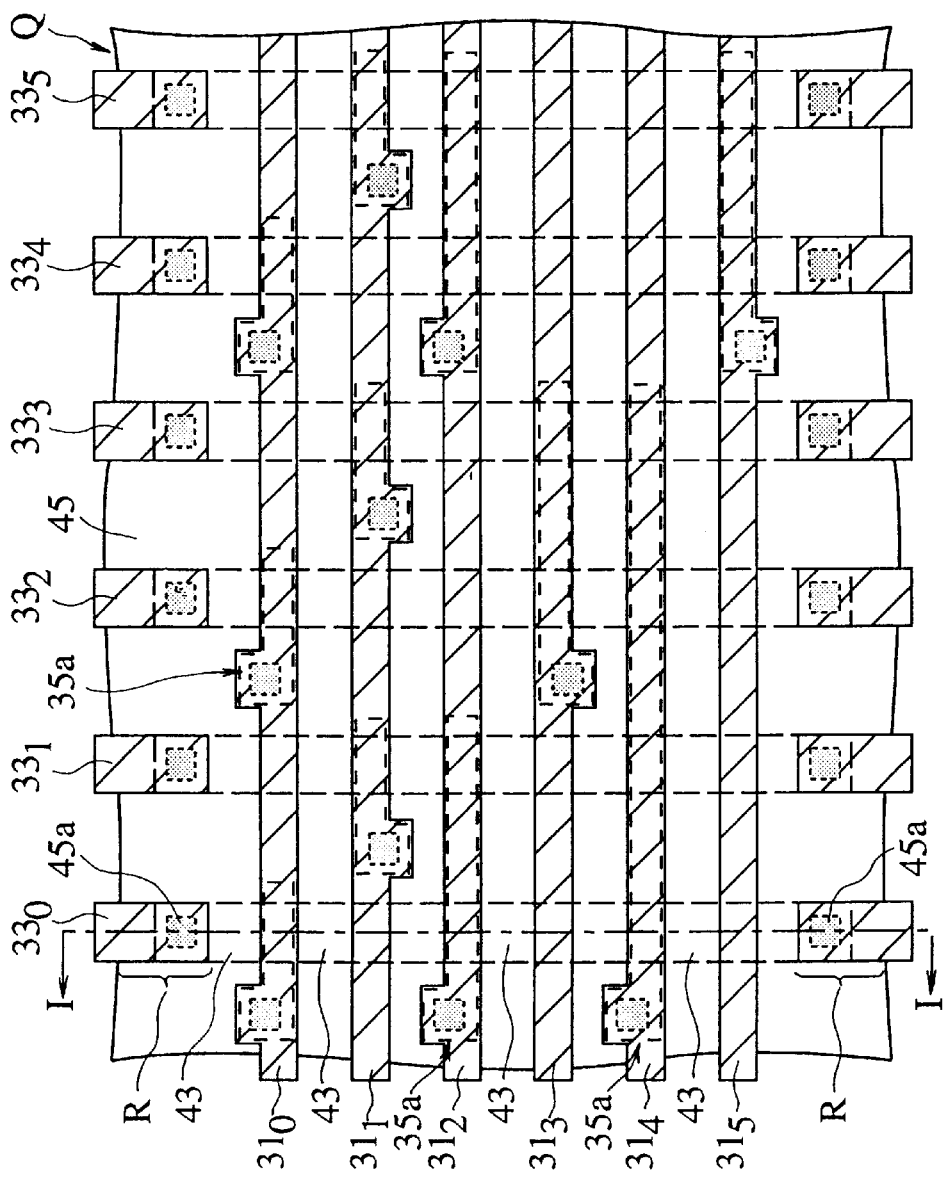
FIG. 11(A) is a plan view for describing the actual structure of a part Q of FIG. 9.
Figure 12:
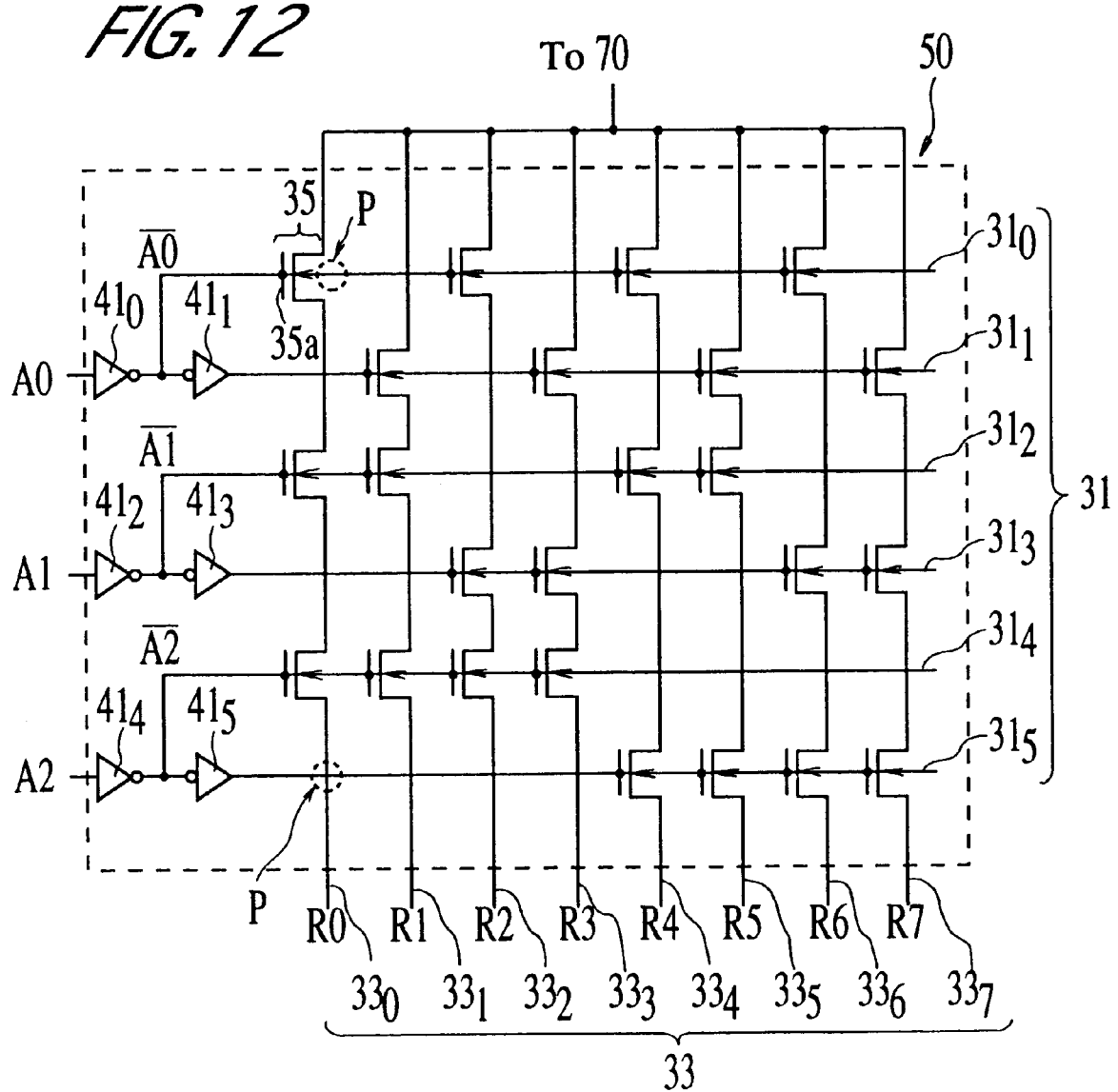
FIG. 12 is a diagram for explaining the prior art and problems thereof, particularly, on the basis of the structure of the conventional column decoder.

Embodiments of the present invention will now be described with reference to the drawings. It is noted that the embodiments of the address decoders according to the present invention can be applied to both the row decoder described with reference to, for example, FIG. 10 and the column decoder described with reference to, for example, FIG. 12. However, the embodiments below will illustrate cases where address decoders are applied to the column decoder which has been described with reference to FIG. 12. In addition, respective figures used in the description show dimensions, shapes and arrangement of the constituent elements only schematically to such an extent that the present invention can be understood. Furthermore, in the explanatory diagrams of the address decoders, the same elements as those described with reference to FIGS. 10 to 12 are denoted by the same reference numerals as those in FIGS. 10 to 12. Description thereto may not be given.

1. First Embodiment Of An Address Decoder

Figure 1:
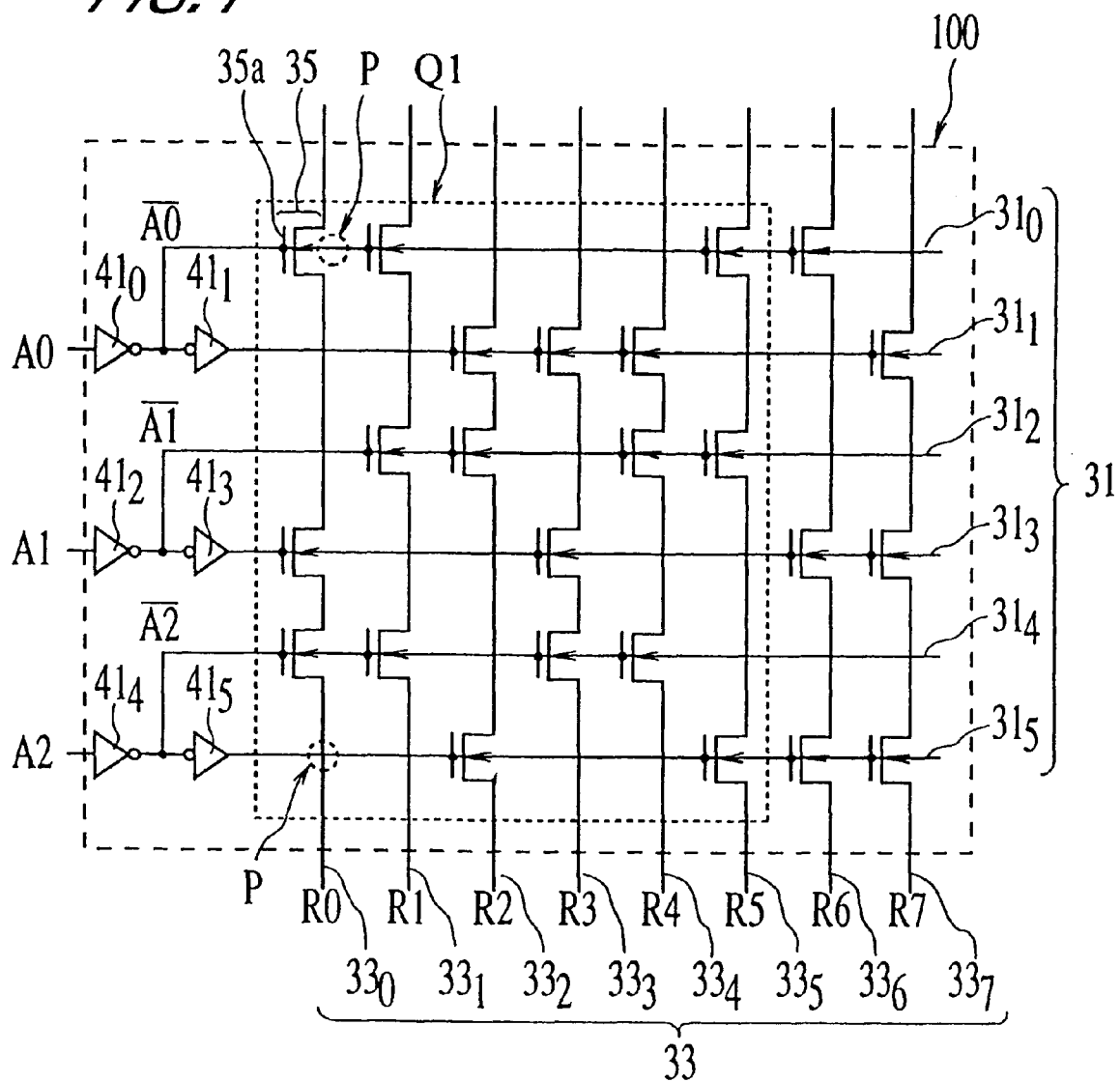
FIG. 1 is a circuit diagram for explaining a first embodiment of the address decoder according to the present invention.

The first embodiment of an address decoder according to the present invention will first be described with reference to FIGS. 1, 2 and Table 2. FIG. 1 is a circuit diagram of an address decoder 100 in the first embodiment according to the present invention. FIG. 2(A) is a plan view showing the actual structure of a part Q of FIG. 1; and FIG. 2(B) illustrates the section of the cross-sectional diagram taken along lines I—I of FIG. 1.

In the address decoder 100, first signal lines $31_0$ to $31_5$ and second signal lines $33_0$ to $33_7$ constitute the matrix arrangement at intersections. Among those intersections, only in areas or the vicinity of the selected intersections, true or normal switching device are connected to the signals. The true switching device means a switching device on/off controlled by an address signal. It is also referred to as an inherent switching device. Description will be given hereinafter, while a transistor device is used as the switching device. In the embodiment of the arrangement shown in FIG. 1, two signal lines are sequentially defined as a pair of signal lines among the first signal lines. An address designation signal is allotted to each pair of the signal lines.

Table 2 is a truth value table showing the relationship between a value m indicated by address designation signals A0, A1 and A2 and a signal line $33_m$ which becomes conductive by the address signals.

Normally, when analyzing an address decoder, a decimal numeral m is varied from low to high numbers, address designation signals A0 to A2 changing in accordance with the decimal numeral m are supplied to the first signal lines and it is examined which second signal lines are conductive.

To attain the objects of the present invention, it is necessary to arrange switching devices in the vicinity of intersections so as not to make it discovered in the vicinity of which intersections forming a matrix, true switching devices are connected while an analysis is made. In consideration of the above point, in the address decoder 100 in this embodiment, intersections in the vicinity of which switching devices are provided, respectively, are set such that, when a value m (where m=0 to 7) is inputted as address designation signals A0, A1 and A2, signal lines other than m-th signal line among 0-th to n-th signal lines $33_0$ to $33_7$ in the second signal line group 33 selectively turns into a first electric state in accordance with five kinds of address designation signals m=0, 1, 2, 4, 5. Here, the first electric state is set to, for example, a conductive state.

That is to say, as shown in Table 2 below, intersections in the vicinity of which switching devices are provided are set such that, when m is 0, 1, 2, 4 or 5, signal lines $33_1$, $33_4$, $33_0$, $33_5$, $33_2$ other than the signal line $33m$ become conductive and when m is 3, 6 or 7, the signal lines $33_3$, $33_6$, $33_7$ corresponding to the value m become conductive.

TABLE 2

| Value m designated by A0–A2 | Signal line in first state (conductive state) among signal lines $33_0$–$33_7$ |
| --- | --- |
| 0 | $33_1$ |
| 1 | $33_4$ |
| 2 | $33_0$ |
| 3 | $33_3$ |
| 4 | $33_5$ |
| 5 | $33_2$ |
| 6 | $33_6$ |
| 7 | $33_7$ |

To realize the operation shown in Table 2, as for the signal line $33_0$ in the second signal line group 33, switching devices 35 are provided in the vicinity of an intersection between the signal line $33_0$ and the signal line $31_0$, an intersection between the signal line $33_0$ and the signal line $31_3$ and an intersection between the signal line $33_0$ and the signal line $31_4$, respectively.

As for the signal $33_1$, switching devices 35 are provided in the vicinity of an intersection between the signal line $33_1$ and the signal line $31_0$, an intersection between the signal line $33_1$ and the signal line $31_2$ and an intersection between the signal line $33_1$ and the signal line $31_4$, respectively.

As for the signal $33_2$, switching devices 35 are provided in the vicinity of an intersection between the signal line $33_2$ and the signal line $31_1$, an intersection between the signal line $33_2$ and the signal line $31_2$ and an intersection between the signal line $33_2$ and the signal line $31_5$, respectively.

As for the signal $33_3$, switching devices 35 are provided in the vicinity of an intersection between the signal line $33_3$ and the signal line $31_1$, an intersection between the signal line $33_3$ and the signal line $31_3$ and an intersection between the signal line $33_3$ and the signal line $31_4$, respectively.

As for the signal $33_4$, switching devices are provided in the vicinity of an intersection between the signal line $33_4$ and the signal line $31_1$, an intersection between the signal line $33_4$ and the signal line $31_2$ and an intersection between the signal line $33_4$ and the signal line $31_4$, respectively.

As for the signal $33_5$, switching devices are provided in the vicinity of an intersection between the signal line $33_5$ and the signal line $31_0$, an intersection between the signal line $33_5$ and the signal line $31_2$ and an intersection between the signal line $33_5$ and the signal line $31_5$, respectively.

As for the signal $33_6$, switching devices 35 are provided in the vicinity of an intersection between the signal line $33_6$ and the signal line $31_0$, an intersection between the signal line $33_6$ and the signal line $31_3$ and an intersection between the signal line $33_6$ and the signal line $31_5$, respectively.

As for the signal $33_7$, switching devices are provided in the vicinity of an intersection between the signal line $33_7$ and the signal line $31_1$, an intersection between the signal line $33_7$ and the signal line $31_3$ and an intersection between the signal line $33_7$ and the signal line $31_5$, respectively.

The way to connect the switching devices 35 to the signal lines, respectively is the same as the conventional way. That is, a gate electrode 35a serving as the control signal input terminal of the switching device 35 is connected to the signal line in the first signal line group 31 in the vicinity of the corresponding intersection, and the switching device 35 per se, that is, the main electrodes thereof are connected, in series, to the second signal line in the second group 33 in the vicinity of the corresponding intersection. More specifically, the switching device 35 is connected such that the main current path thereof is inserted, in series, into the signal line in the second signal line group 33.

Since the intersections in the vicinity of which the switching devices 35 are provided, respectively, are selected as described above, the arrangement of the switching devices 35 in the address decoder in this embodiment is irregular compared to that in the conventional address decoder (column decoder). Therefore, a third party, even if trying to analyze which signal line in the second signal line group is conductive in accordance with certain address designation signals, has difficulty doing so, compared to the conventional decoder.

In the above embodiment, description has been given to a case where one signal line $33_x$ (x≠m) other than the signal line $33_m$ is conductive in accordance with five kinds of address designation signals m=0, 1, 2, 4, 5, respectively. However, this is only an example and the present invention should not be limited thereto. If switching devices 35 are arranged such that one signal line $33_x$ (x≠m) other than the signal line $33_m$ is conductive in accordance with at least two kinds of address designation signals m, respectively, the advantage of the first embodiment can be obtained. Therefore, it is possible that the signal line $33_x$ (x≠m) other than m-th signal line $33_m$ among the signal lines $33_0$ to $33_n$ is selectively conductive in accordance with, for example, two kinds of address designation signals m, respectively.

Alternatively, it is possible that the signal line $33_x$ (x≠m) other than m-th signal line $33_m$ of the signal lines $33_0$ to $33_n$ is selectively conductive in accordance with all address designation signals m, respectively.

The above embodiment has illustrated a case of decoding eight ($2^3$) signal lines $33_0$ to $33_7$. Needless to say, the first embodiment is applicable to other scales of address decoders. To be specific, if the second signal line group 33 consists of $2^n$ signal lines, address designation signals are n bit signals and n switching devices are connected to respective second signal lines based on the concept of the first embodiment. It is, thereby, possible to apply this embodiment to various scales of address decoders.

2. The Second Embodiment Of An Address Decoder

Figure 3:
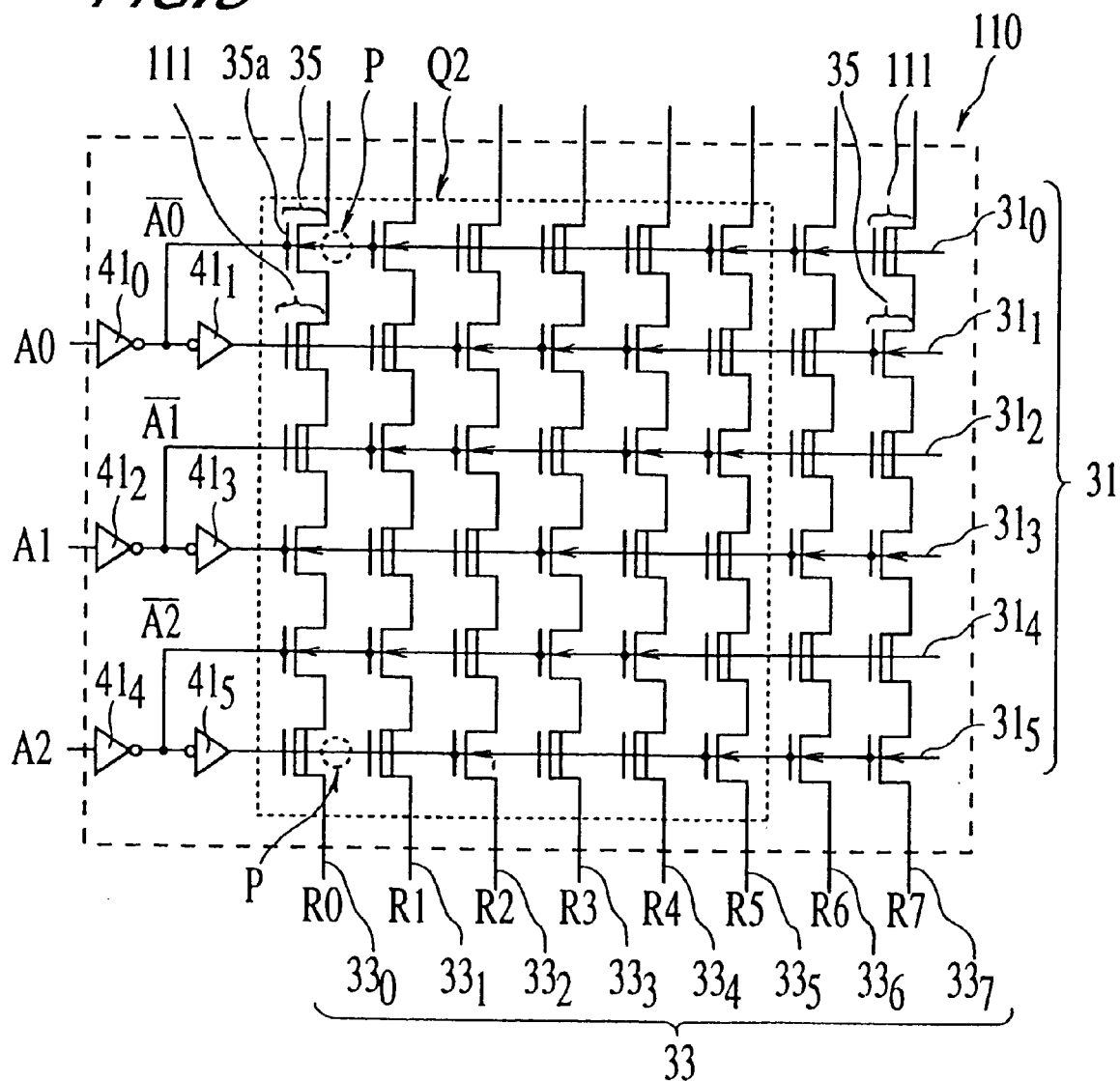
FIG. 3 is a circuit diagram for explaining the second embodiment of an address decoder according to the present invention and a circuit diagram of the address decoder.

Next, the second embodiment of an address decoder according to the present invention will be described with reference to FIGS. 3 and 4. FIG. 3 is a circuit diagram of the address decoder 110 in the second embodiment. FIG. 4(A) is a plan view showing the truth structure of a part Q2 of FIG. 3. FIG. 4(B) is a cross-sectional diagram taken along lines I—I of FIG. 4(A). The cross-sectional diagram of FIG. 4(B) shows emphatically the section.

In the second embodiment of the address decoder, among intersections between signal lines in the first signal line group 31 and signal lines in the second signal line group 33, constantly conductive switching devices 111 as dummy or pseudo switching devices are provided in the vicinity of all or part of intersections other than those in the vicinity of which inherent, that is, true switching devices 35 on/off controlled in accordance with address designation signals. It is noted that the dummy switching devices 111 are connected to signal lines in the first signal line group 31 in the vicinity of the intersections belonging to the respective control signal input terminals thereof and the devices 111 themselves are connected, in series, to signal lines in the second signal line group 33. The dummy or pseudo switching devices mean switching devices which are not on/off controlled by address designation signals. Description below will given to a case where these dummy switching devices consist of transistor switching devices.

Namely, in the address decoder 110 in this embodiment, among intersections between signal lines in the first signal line group 31 and those in the second signal line group 33, constantly conductive switching devices 111 are provided in the vicinity of all of the intersections other than those in the vicinity of which true switching devices 35 on/off controlled by address designation signals are provided.

As true switching devices 35, N-channel type field effect transistors of, for example, enhancement type are used. As constantly conductive switching devices 111, field effect transistors of, for example, depletion type are used. If depletion type field effect transistors are used as constantly conductive switching devices 111, channels 111a can be formed in advance by injecting impurities into planned regions for forming constantly conductive switching devices 111 on the semiconductor substrate 42, as shown in FIG. 4(B). To make it difficult to discriminate the depletion type field effect transistors 111 from the enhancement type field effect transistors 35, the transistors 11 preferably have the same dimensions, such as a gate length and a gate width, as those of the transistors 35.

Since the channels 111a for the depletion type field effect transistors 111 per se are invisible, a third party recognizes the address decoder 110 as if true switching devices 35 are arranged in the vicinity of intersections, respectively therein. As a result, even if a third party tries to analyzes which signal line in the second signal line group 33 is conductive according to address designation signals, he or she finds it more difficult to do so than in the conventional case.

As described above, in this embodiment, the constantly conductive switching devices 111 as dummy switching devices are provided in all of the intersections other than those in the vicinity of which true switching devices 35 are provided. As can be seen from FIG. 4(A), therefore, control signal input terminals (i.e. gate electrodes) of the switching devices 35 and of the constantly conductive switching devices 111 arranged along the first signal lines $31_0$ to $31_5$, respectively, can serve as band-shaped gate electrodes bridging between the switching devices. In other words, with such a structure, gate electrodes can be formed more easily than in the case of providing constantly conductive switching devices 111 in the vicinity of part of intersections other than those in the vicinity of which the switching devices are provided, respectively. Besides, the address decoder 110 in this embodiment can obtain a novel advantage that the number of nodes between the gate electrodes and the first signal lines is reduced. If the number of contacts points between the gate electrodes and the first signal lines is reduced, the area for the formation of the address decoder can be reduced as a whole.

It should be emphasized that the way to arrange true switching devices 35 is not particularly limited in the second embodiment according to the present invention. This is because the constantly conductive switching devices 111 are mixedly provided among the true switching devices 35 and therefore it is difficult for a third party to analyze which signal line in the second signal line group is conductive according to address designation signals.

For the above reason, in the second embodiment according to the present invention, it does not matter whether the true switching devices 35 are regularly arranged as described with reference to FIG. 12 or irregularly arranged as described with reference to FIG. 1. Despite this, for purposes of making it more difficult for a third party to analyze which signal line in the second signal line group is conductive according to address designation signals, it is desirable that the true switching devices 35 are arranged irregularly. In the address decoder 110 in this embodiment, the true switching devices 35 are irregularly arranged as described with reference to FIG. 1.

3. The Third Embodiment Of An Address Decoder

The third embodiment of an address decoder according to the present invention will now be described with reference to FIGS. 5(A) and 5(B). FIG. 5(A) is a plan view showing part of an address decoder 120 in this embodiment. In the plan view of FIG. 5(A), hatching is given to emphatically show the region. FIG. 5(A) is also a plan view of a part corresponding to the part Q1 shown in FIG. 1 or the part Q2 shown in FIG. 3. FIG. 5(B) is a cross-sectional view taken along lines I—I of FIG. 5(A). In FIG. 5(B), a section is emphatically illustrated.

The address decoder 120 in the third embodiment comprises a shielding film 121 for preventing the connection relationship between control signal input terminals 35a of the switching devices 35 and signal lines 310 to 315 in the first signal line group 31, respectively, from being recognized visually.

Namely, the address decoder 120 in this embodiment comprises a shielding film 121 covering the entire region including all of the intersections between a first wiring line group 31 and a second wiring line group 33.

The shielding film 121 may be made of freely chosen material from those which are opaque to prevent the visual observation by a third party and which do not deteriorate the reliability of the address decoder. Such material include, for example, metals used for forming wiring members such as aluminum, gold, silver and copper and a silicon oxide film, polymer and the like used as interlayer insulating films.

In addition, the shielding film 121 can be made of part of a second wiring layer when forming a semiconductor memory. In such a case, after the first wiring member 31 and the like are formed, an insulating film (not shown) is formed. A shielding film made of part of the second wiring layer is then provided on the insulating film. Alternatively, if the shielding film 121 is made of conductive material, it does not matter whether or not the potential of the shielding film 121 is fixed to a certain potential (such as a power supply potential and a ground potential).

The way to arrange the true switching devices 35 is not particularly limited in the third embodiment. This is because the arrangement of the switching devices 35 per se can be shielded by the shielding film 121 and therefore a third party finds it difficult to analyze which signal line in the second signal line group is conductive according to address designation signals.

For that reason, according to the third embodiment, it does not matter whether the true switching devices 35 are arranged regularly as described with reference to FIG. 12 or irregularly as described with reference to FIG. 1. However, for purposes of making it more difficult for a third party to analyze which signal line in the second signal line group is conductive according to address designation signals, the true switching devices 35 are preferably arranged irregularly.

Further, the region where the shielding film 121 is provided should not be limited to that shown in FIG. 5. It is of course possible to provide the shielding film 121 in a region having a larger area than that of the region shown in FIG. 5. For example, it is acceptable to cover the entire address decoder region with the shielding film 121.

4. The Embodiment Of A Semiconductor Memory

Next, the embodiment of a semiconductor memory according to the present invention will be described. A semiconductor memory can be formed by, for example, using the address decoder described with reference to FIGS. 1, 3 or 5 as at least one of a row decoder 30 and a column decoder. By so doing, it is possible to realize a semiconductor memory capable of making it more difficult for a third party to misuse data and the like than in the conventional case.

Figure 9:
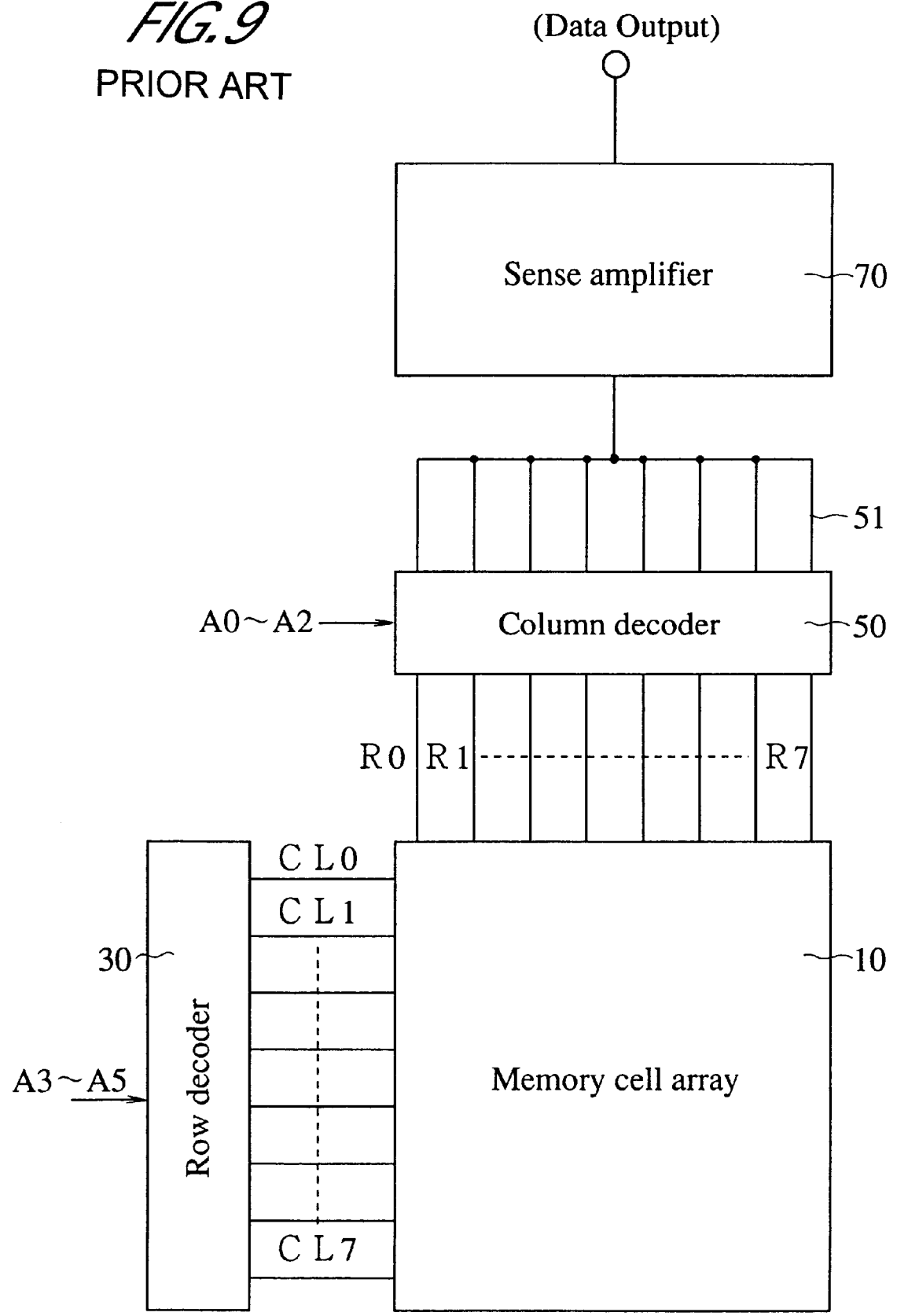
FIG. 9 is a diagram for explaining the prior art and the problems thereof, particularly, on the basis of one example of the structure of the semiconductor device.

If the row decoder 30 of the semiconductor memory described with reference to FIG. 9 is replaced by the address decoder in any of the embodiments according to the present invention, it is necessary to use one of the following address decoders 1), 2) 3) or 4): 1) An address decoder provided by modifying switching devices 35 of row decoder 30 described with reference to FIG. 10 in accordance with the concept of the first embodiment of the present invention; 2) an address decoder provided by arranging constantly conductive switching devices in the switching device matrix of the row decoder 30 described with reference to FIG. 10 in accordance with the concept of the second embodiment of the present invention; 3) an address decoder provided by having the row decoder 30 described with reference to FIG. 10 provided with a shielding film in accordance with the third embodiment of the present invention; and 4) an address decoder provided by a combination of not less than two address decoders of the 1) to 3) address decoders.

5. The Embodiment Of A Semiconductor Memory Comprising A Logical Product Circuit (Or A Logical Add Circuit)

Figure 6A:
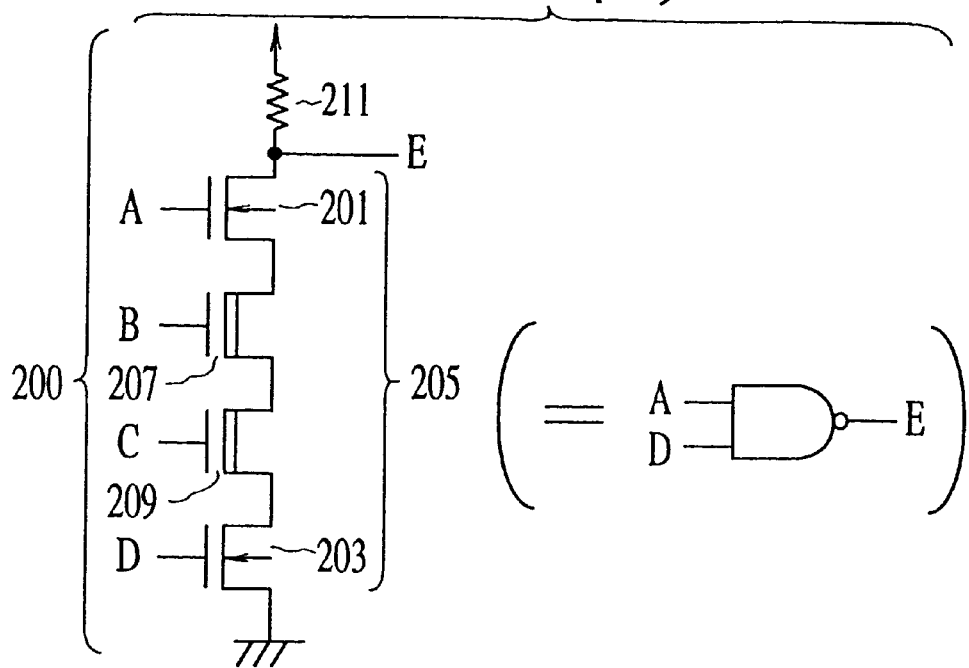
FIG. 6(A) is a circuit diagram where the AND circuit is emphatically illustrated.
Figure 6B:
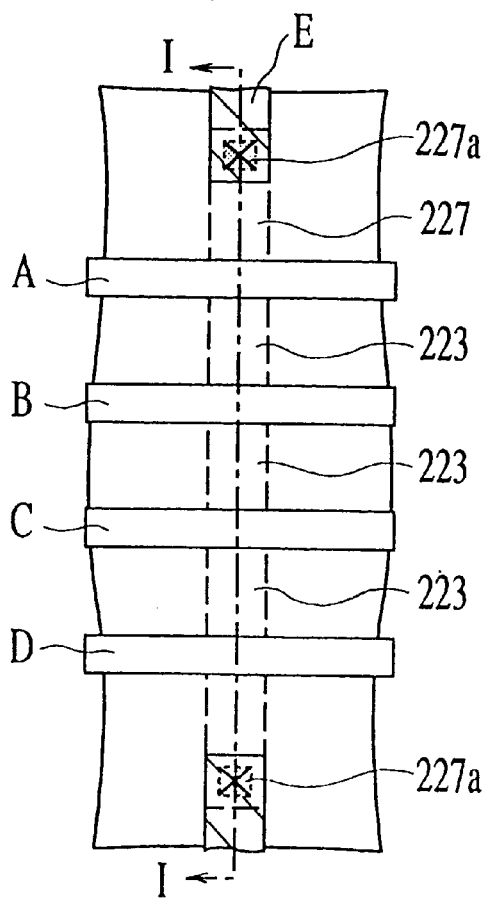
FIG. 6(B) is a plan view for describing the actual structure of the part shown in FIG. 6(A)
Figure 6C:
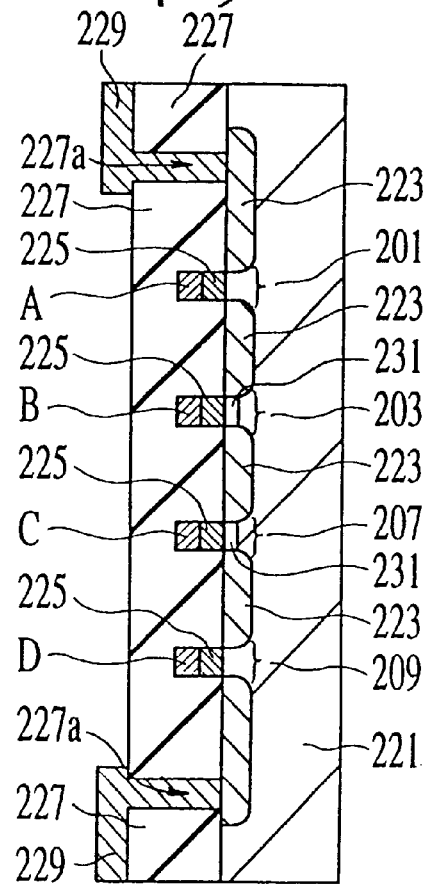
FIG. 6(C) is a cross-sectional view taken along lines I—I of FIG. 6(B)

FIG. 6 illustrated the embodiment of a semiconductor memory comprising a logical product (or an NAND in this case) circuit 200. Particularly, FIG. 6(A) is a circuit diagram where the NAND circuit 200 is illustrated; FIG. 6(B) is a plan view showing the actual structure of the logical product circuit 200; and FIG. 6(C) is a cross-sectional diagram taken along lines I—I of FIG. 6(B). It is noted that the cross-sectional diagram of FIG. 6(C) illustrates a section. In FIGS. 6(B) and 6(C), reference numeral 221 denotes a silicon substrate serving as a semiconductor substrate; 223 an impurity diffused region serving as a source-drain region; 225 a gate insulating film; 227 an interlayer insulating film; 227a a contact hole; 229 a first wiring layer; and 231 a channel formed in each of depletion type transistors 207 and 209.

The logical product circuit 200 comprises a switching device sequence or array 205 connecting two enhancement type N-channel field effect transistors 201 and 203 in series, two depletion type field effect transistors 207 and 209 connected in series to the switching device sequence 205 and a pull-up resistor 211 for pulling up the output node of the series circuit consisting of these transistors 201, 203, 207 and 209 to the power supply.

The pull-up resistor as well as pull-down resistor to be described below can be, for example, a resistor comprising the impurity diffused layer formed on the semiconductor substrate or an appropriate resistor such as a resistor made by connecting the gate electrode and the source electrode (or drain electrode) of a field effect transistor. The same thing is true of a semiconductor device comprising an inverter circuit to be described later.

The node or connection point between the series circuit 205 consisting of transistors connected in series and the pull-up resistor 211, serves as an output terminal E of the logical product circuit 200. Control signal input terminals (gate electrodes) A to D of the transistors 201, 203, 207 and 209, respectively, serve as input terminals of the logical product circuit 200. However, out of the input terminals A to D, only the input terminals A and D relate to the logical operation of the circuit 200 in this embodiment. The reason is that the transistors having the input terminals B and C are constantly conductive, that is, dummy transistors.

Therefore, the logical product circuit 200 appears to be an NAND circuit having four inputs; however, it is actually an NAND circuit having two inputs.

However, if a third party visually observes the logical product circuit 200, he or she recognizes four gate electrodes as input terminals as shown in FIG. 6(B). Besides, the third party cannot visually discover that the transistors 207, 209 are of depression type. Due to this, he or she recognizes the logical product circuit 200 as that having four inputs. As a result, it is possible to make the third party erroneously recognize the semiconductor device, thereby making it difficult for the third party to, for example, imitate the semiconductor device.

Figure 7:
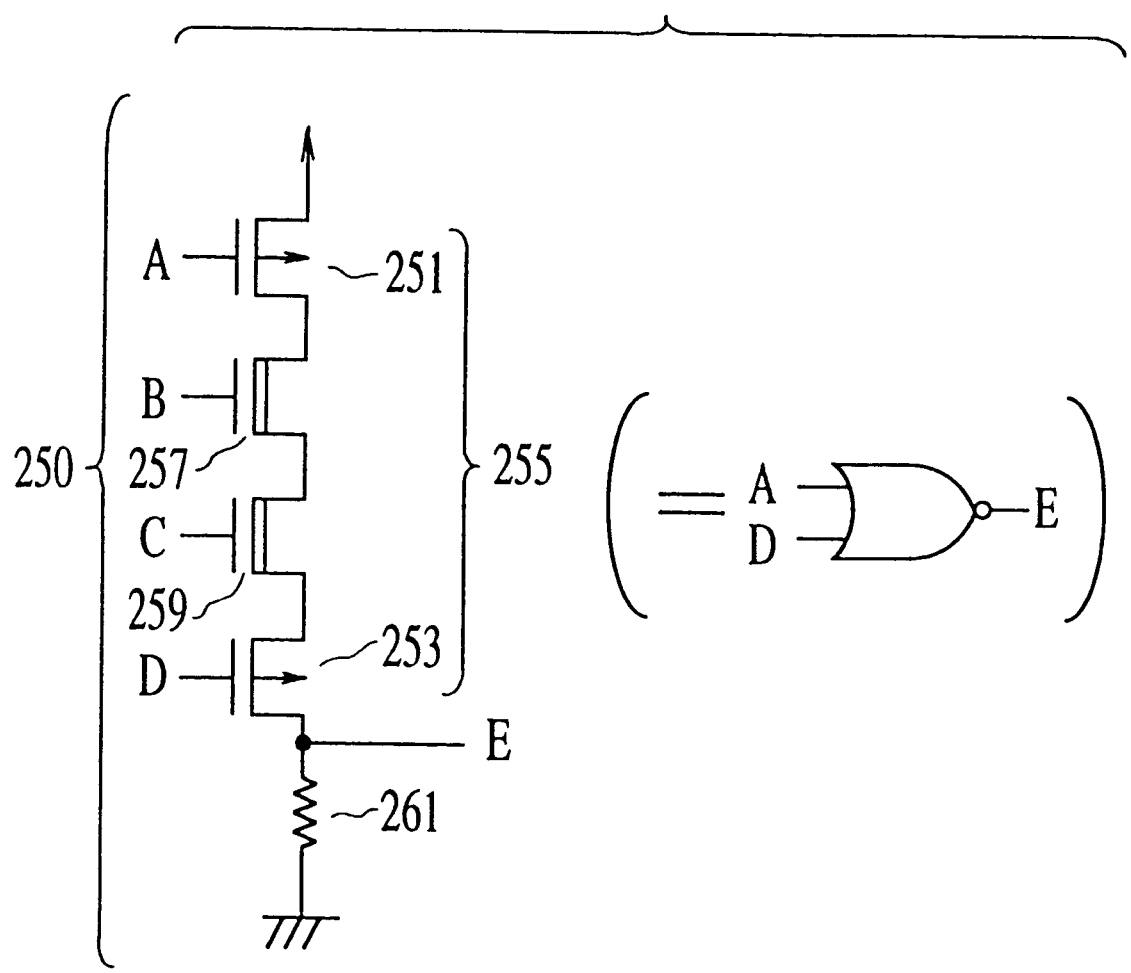
FIG. 7 is a circuit diagram for explaining a semiconductor device comprising a logical add circuit, in which the logical add circuit is emphatically illustrated.

FIG. 7 illustrates the embodiment of a semiconductor device comprising a logical add circuit (NOR circuit in this embodiment) 250. Particularly, FIG. 7 is a circuit diagram where the logical add circuit 250 according to the present invention is emphatically illustrated.

The logical add circuit 250 comprises a switching device sequence 255 connecting two enhancement type P-channel field effect transistors 251 and 253 in series, two depletion type field effect transistors 257 and 259 connected in series to the switching device sequence 255, and a pull-down resistor 261 for pulling down the output node of the series circuit consisting of these transistors 251, 253, 257 and 259 to the power supply.

The node between the series circuit 255 comprising those transistors and the pull-down resistor 261, serves as an output terminal E of the logical add circuit 250. Gate electrodes A to D of the transistors 251, 253, 257 and 259, respectively, serve as input terminals of the logical add circuit 250. However, out of the input terminals A to D, only the input terminals A and D relate to the logical operation of the circuit 250 in this embodiment. The reason is that the transistors having the input terminals B and C are constantly conductive transistors, that is, dummy transistors.

Therefore, the logical add circuit 250 appears to be an NOR circuit having four inputs; however, it is actually an NOR circuit having two inputs.

However, if a third party visually observes the logical add circuit 250, he or she recognizes four gate electrodes as input terminals as in the case of the above-described logical product circuit 200. Besides, the third party cannot visually discover that the transistors 257, 259 are of depletion type. Due to this, he or she recognizes the logical add circuit as that having four inputs. As a result, it is possible to make the third party erroneously recognize the semiconductor device, thereby making it difficult for the third party to, for example, imitate the semiconductor device.

This embodiment illustrates the semiconductor device wherein two on/off type switching devices and two constantly conductive switching devices are used. However, it is possible to change the number of the on/off switching devices according to the number of inputs of the logical product circuit or logical add circuit. Moreover, the number of the constantly conductive switching devices may be at least one and can be changed appropriately, as long as it does not depart from the objects and concept of the present invention.

6. The Embodiment Of A Semiconductor Device Comprising An Inverter Circuit

Next, the embodiment of a semiconductor device comprising an inverter circuit according to the present invention will be described. Each of FIGS. 8(A) to 8(C) is an explanatory diagram of the semiconductor device and emphatically illustrates an inverter circuit provided in the semiconductor device.

An inverter circuit 500 shown in FIG. 8(A) comprises an n-channel field effect transistor 501 having a control signal input terminal a and serving as a switching device on/off controlled in accordance with a control signal, a pull-up resistor 503 pulling up the output node of the transistor 501 to the power supply and a depletion type field effect transistor 505 connected to the transistor 501 in series, having a control terminal b and serving as a constantly conductive switching device.

In the embodiment of FIG. 8(A), the transistor 505 is provided between the transistor 501 and the ground. However, the transistor 505 may be provided between, for example, the transistor 501 and the resistor 503.

The inverter circuit 500 shown in FIG. 8(A) appears to be a logical product circuit having two inputs, i.e. input terminals a and b. However, since the transistor 505 is of depression type, the circuit 500 is actually an inverter circuit.

However, if a third party visually observes the inverter circuit 500, he or she recognizes two gate electrodes a and b as input terminals. Besides, the third party cannot visually discover that the transistor 505 is of depression type. Due to this, the inverter circuit 500 is recognized as a logical product circuit having two inputs by the third party. Therefore, it is possible to make the third party erroneously recognize the semiconductor device, thereby making it difficult for the third party to, for example, imitate the device.

An inverter circuit 510 shown in FIG. 8(B) comprises a p-channel field effect transistor 511 having a control signal input terminal a and serving as a switching device on/off controlled in accordance with a control signal, a pull-down resistor 513 pulling down the output node of the transistor 511 to the ground and a depletion type field effect transistor 515 connected to the transistor 511 in series, having a control terminal b and serving as a constantly conductive switching device.

In the embodiment of FIG. 8(B), the transistor 515 is provided between the transistor 511 and the resistor 513. However, the transistor 515 may be provided between, for example, the transistor 511 and the power supply.

The inverter circuit 510 shown in FIG. 8(B) appears to be a logical add circuit having two inputs, i.e. input terminals a and b. However, since the transistor 515 is of depletion type, the circuit 510 is actually an inverter circuit.

However, if a third party visually observes the inverter circuit 510, he or she recognizes two gate electrodes a and b as input terminals. Besides, the third party cannot visually discover that the transistor 515 is of depletion type. Due to this, the inverter circuit 510 is recognized as a logical add circuit having two inputs by the third party. Therefore, it is possible to make the third party erroneously recognize the semiconductor device, thereby making it difficult for the third party to, for example, imitate the device.

An inverter circuit 520 shown in FIG. 8(C) comprises a series circuit 525 connecting a p-channel field effect transistor 521 and an n-channel field effect transistor 523 in series and a depletion type field effect transistor 527 connected to the series circuit 525 in series and having a control terminal b. Furthermore, gate electrodes of the p-channel and n-channel field effect transistors 521, 523 are connected to each other to provide an input terminal a.

The inverter circuit 520 shown in FIG. 8(C) appears to be a logical circuit having two inputs a and b. However, since the transistor 527 is of depletion type, the circuit 520 is actually an inverter circuit.

However, if a third party visually observes the inverter circuit 520, he or she recognizes two gate electrodes a and b as input terminals. Besides, the third party cannot visually discover that the transistor 527 is of depletion type. Due to this, he or she finds it difficult to recognize the inverter circuit 520 as such. Therefore, it is possible to make the third party erroneously recognize the semiconductor device, thereby making it difficult for the third party to, for example, imitate the device.

In this embodiment of the semiconductor device comprising an inverter circuit described above, description is given to a case where a constantly conductive switching device is provided therein. However, it is of course possible to provide not less than two constantly conductive switching devices in the semiconductor device.

As is obvious from the above description given so far, the address decoder according to the present invention comprises a first signal line group into which address designation signals m (where m=0 to n) are inputted, a second signal line group intersecting the first signal line group and consisting of signal lines numbered 0 to n and predetermined switching devices provided in the vicinity of a plurality of predetermined intersections out of those between the signal lines in the first signal line group and those in the second signal line group.

In the address decoder in the first embodiment according to the present invention, the predetermined intersections are set such that one of signal line other than m-th signal line among the 0-th to n-th signal lines is conductive according to at least two kinds of address designation signals.

In the address decoder in the second embodiment according to the present invention, constantly conductive switching devices are provided in the vicinity of all or part of the intersections other than the above-described predetermined intersections.

In the address decoder in the third embodiment according to the present invention, a shielding film is provided so as to prevent the connection relationship between control signal input terminals of the switching devices and the signal lines in the first signal line groups, respectively, from being visually recognized.

Owing to the above, in the address decoders in the first and second embodiments, the switching devices are arranged irregularly compared to those in the conventional address decoder described with reference to FIGS. 9 and 12. In addition, in the address decoder in the third embodiment, the arrangement of switching devices per se can be visually shielded. Based on these respects, it is understood that according to the address decoders in the first to third embodiments of the present invention, even if a third party tries to analyze which signal line out of the signal lines in the second signal line group turns into a first state according to address designation signals from the arrangement of the switching devices, he or she finds it more difficult to do so than in the case of the conventional address decoder. Therefore, it is possible to make difficult the analysis of the semiconductor device or that of data within the memory cell array (or typically ROM) by the third party, thereby improving a security function compared to the conventional case.

Moreover, in the semiconductor memory according to the present invention, at least one of a row decoder and a column decoder consists of the address decoder of the present invention. Therefore, it is possible to realize a semiconductor memory capable of making it difficult for a third party to analyze it or data within the memory cell array (or typically ROM).

Additionally, as can be seen from the semiconductor device comprising a logical product circuit and that comprising a logical add circuit, the present invention can realize a semiconductor device apparently comprising (n+α) (where α is an integer not less than 1) logical product circuits (or logical add circuits) by connecting a constantly conductive switching device to a switching device sequence connecting n true on/off type switching devices in series. As a result, although the circuit is actually a logical product circuit or logical add circuit having n inputs (where n is an integer of not less than 1), it is possible to make a third party visually realize the circuit as that having (n+α) inputs (where α is an integer not less than 1). This can make it difficult for the third party to, for example, imitate the semiconductor device.

Furthermore, as can be seen from the semiconductor device comprising an inverter circuit according to the present invention. the present invention can realize a semiconductor device comprising an inverter circuit which is difficult to recognize as such by further connecting, in series, a constantly conductive switching device to a switching device on/off controlled by a control signal. This can make it difficult for a third party to, for example, imitate the semiconductor device.

Description has been given to embodiments wherein a switching device consists of transistors. However, if possible, other electronic switch device and the like may be utilized.

What is claimed is:

1. A logic circuit comprising:

a plurality of input terminals receiving true control signals and dummy control signals, each of the true and dummy control signals having an active level and an inactive level, the dummy control signals having either the active level or the inactive level independent of the level of the true control signals;

a plurality of MOS transistors connected in series, one end of said serially connected MOS transistors being connected to ground, said MOS transistors having gates respectively connected to said input terminals, said MOS transistors including a switching MOS transistor having a conductive state controlled to be on by a true control signal having the active level received at the gate of the switching MOS transistor and including a constantly conductive MOS transistor receiving a dummy control signal at the gate of the constantly conducting MOS transistor, the constantly conducting MOS transistor being in a conductive state regardless of the level of the dummy control signal applied to the gate thereof so that only the true control signal functions as an input signal of said logic circuit, wherein the constantly conductive MOS transistor is provided for confusing an analyzer of the logic circuit; and an output terminal for outputting a signal based on the true control signal.

2. A logic circuit according to claim 1, wherein the logic circuit operates as an inverter.

3. A logic circuit according to claim 1, wherein said logic circuit has at least two switching MOS transistors so that the logic circuit operates as a NAND circuit.

4. A logic circuit according to claim 1, wherein said switching MOS transistor is an enhancement type MOS transistor and said constantly conductive MOS transistor is a depletion type MOS transistor.

5. A logic circuit according to claim 1, wherein said serially connected MOS transistors are connected to each other by an impurity region formed in a substrate.

6. A logic circuit according to claim 1, wherein said switching MOS transistor is an n-type MOS transistor.

7. A logic circuit comprising:

a plurality of input terminals receiving true control signals and dummy control signals, each of the true and dummy control signals having an active level and an inactive level, the dummy control signals having either the active level or the inactive level independent of the level of the true control signals;

a plurality of MOS transistors connected in series, one end of said serially connected MOS transistors being connected to a power supply, said MOS transistors having gates respectively connected to said input terminals, said MOS transistors including a switching MOS transistor having a conductive state controlled to be on by a true control signal having the active level received at the gate of the switching MOS transistor and including a constantly conductive MOS transistor receiving a dummy control signal at the gate of the constantly conducting MOS transistor, the constantly conducting MOS transistor being in a conductive state regardless of the level of the dummy control signal applied to the gate thereof so that only the true control signal functions as an input signal of said logic circuit, wherein the constantly conductive MOS transistor is provided for confusing an analyzer of the logic circuit;

an output terminal connected to an other end of said serially connected MOS transistors; and a pull-down MOS transistor connected between said output terminal and ground.

8. A logic circuit according to claim 7, wherein the logic circuit operates as an inverter.

9. A logic circuit according to claim 7, wherein said logic circuit has at least two switching MOS transistors so that the logic circuit operates as a NOR circuit.

10. A logic circuit according to claim 7, wherein said switching MOS transistor is an enhancement type MOS transistor and said constantly conductive MOS transistor is a depletion type MOS transistor.

11. A logic circuit according to claim 7, wherein said serially connected MOS transistors are connected to each other by an impurity region formed in a substrate.

12. A logic circuit according to claim 7, wherein said switching MOS transistor is a p-type MOS transistor.

13. An inverter circuit comprising:

a plurality of MOS transistors connected in series, said plurality of serially connected MOS transistors being connected between a power supply and ground, said MOS transistors including a p-type switching MOS transistor having a conductive state controlled to be either on or off by a first control signal received at a gate of the p-type switching MOS transistor, an n-type switching MOS transistor having a conductive state controlled to be either on or off by the first control signal received at a gate of the n-type switching MOS transistor, and a constantly conductive MOS transistor receiving a second control signal at a gate of the constantly conducting MOS transistor, the constantly conducting MOS transistor being in a conductive state regardless of a state of the second control signal;

an input terminal connected to the gates of said switching MOS transistors; and an output terminal connected to drains of said switching MOS transistors.

14. An inverter circuit according to claim 13, wherein said switching MOS transistors are enhancement type MOS transistors and said constantly conductive MOS transistor is a depletion type MOS transistor.

15. An inverter circuit according to claim 13, wherein said serially connected MOS transistors are connected to each other by an impurity region formed in a substrate.

* * * * *

UNITED STATES PATENT AND TRADEMARK OFFICE
CERTIFICATE OF CORRECTION

PATENT NO.   : 6,137,318
DATED        : October 24, 2000
INVENTOR(S)  : Takaaki Kodama It is certified that error appears in the above-identified patent and that said Letters Patent is hereby corrected as shown below:

<u>Title page,</u>
Item [75], change "Kodama Takaaki" to -- Takaaki Kodama --.

Signed and Sealed this

Twentieth Day of May, 2003

JAMES E. ROGAN
*Director of the United States Patent and Trademark Office*